US012586646B2

(12) United States Patent
Guo et al.

(10) Patent No.: US 12,586,646 B2
(45) Date of Patent: Mar. 24, 2026

(54) PRECHARGE SCHEME DURING PROGRAMMING OF A MEMORY DEVICE

(71) Applicant: Sandisk Technologies, Inc., Milpitas, CA (US)

(72) Inventors: Jiacen Guo, Cupertino, CA (US); Han-Ping Chen, San Jose, CA (US); Henry Chin, San Jose, CA (US); Guirong Liang, Cupertino, CA (US); Xiang Yang, Santa Clara, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 293 days.

(21) Appl. No.: 17/903,618

(22) Filed: Sep. 6, 2022

(65) Prior Publication Data

US 2024/0079062 A1     Mar. 7, 2024

(51) Int. Cl.
| | |
|---|---|
| *G11C 16/10* | (2006.01) |
| *G11C 11/56* | (2006.01) |
| *G11C 16/04* | (2006.01) |
| *G11C 16/08* | (2006.01) |

(Continued)

(52) U.S. Cl.
CPC .......... *G11C 16/10* (2013.01); *G11C 11/5628* (2013.01); *G11C 11/5671* (2013.01); *G11C 16/0483* (2013.01); *G11C 16/08* (2013.01); *G11C 16/32* (2013.01); *G11C 16/3427* (2013.01); *G11C 16/3459* (2013.01)

(58) Field of Classification Search
CPC . G11C 16/10; G11C 11/5628; G11C 11/5671; G11C 16/0483; G11C 16/08; G11C 16/32; G11C 16/3427; G11C 16/3459; G11C 2211/5621
See application file for complete search history.

(56) References Cited

U.S. PATENT DOCUMENTS

| | | | | |
|---|---|---|---|---|
| 9,583,201 B1 * | 2/2017 | Lee | ......................... | G11C 16/10 |
| 10,580,504 B2 * | 3/2020 | Zhao | ...................... | G11C 16/10 |
| 10,741,253 B1 * | 8/2020 | Lu | .......................... | G11C 16/14 |

(Continued)

FOREIGN PATENT DOCUMENTS

| | | |
|---|---|---|
| JP | 2010102792 A | 5/2010 |
| JP | 2017059276 A | 3/2017 |
| KR | 20190026431 A | 3/2019 |

*Primary Examiner* — Amir Zarabian
*Assistant Examiner* — Justin Bryce Heisterkamp
(74) *Attorney, Agent, or Firm* — Dickinson Wright PLLC

(57) ABSTRACT

The memory device includes at least one memory block with source and drain sides and a plurality of memory cells arranged in a plurality of word lines. The word lines are arranged in a plurality of independently programmable and erasable sub-blocks. Control circuitry is configured to program the memory cells of a selected sub-block and determine a location of the within the at least one memory block and determine a programming condition of at least one unselected sub-block. The control circuitry is also configured to program at least one word line in the selected sub-block in a plurality of program loops that include pre-charging processes. The control circuitry pre-charges a plurality of channels from either the source or drain side based on at least one of the location of the selected sub-block within the memory block and the programming condition of the at least one unselected sub-block.

18 Claims, 21 Drawing Sheets

(51) Int. Cl.
    *G11C 16/32*       (2006.01)
    *G11C 16/34*       (2006.01)

(56)                References Cited

U.S. PATENT DOCUMENTS

| | | | |
|---|---|---|---|
| 11,139,038 B1 * | 10/2021 | Masuduzzaman | ........................... |
| | | | G11C 16/3427 |
| 2017/0076814 A1 * | 3/2017 | Hashimoto | ............ H10B 43/27 |
| 2018/0374551 A1 * | 12/2018 | Hu | .................... G11C 16/3459 |
| 2019/0074065 A1 * | 3/2019 | Park | .................. G11C 16/0483 |
| 2019/0378581 A1 | 12/2019 | Zhao et al. | |
| 2019/0385658 A1 * | 12/2019 | Lee | .................... G11C 11/4072 |
| 2020/0168276 A1 | 5/2020 | Yang | |
| 2020/0265897 A1 | 8/2020 | Lu et al. | |
| 2020/0402590 A1 * | 12/2020 | Park | ....................... G11C 16/24 |
| 2021/0280261 A1 * | 9/2021 | Yang | ................... G06F 3/0679 |
| 2022/0215888 A1 | 7/2022 | Song et al. | |
| 2023/0050955 A1 * | 2/2023 | Zhao | ...................... G11C 16/24 |
| 2023/0069260 A1 * | 3/2023 | Lien | ...................... G11C 16/10 |
| 2023/0154538 A1 * | 5/2023 | Yang | ...................... G11C 16/08 |
| | | | 365/185.17 |
| 2023/0253046 A1 * | 8/2023 | Li | ........................ G11C 16/10 |
| | | | 365/185.17 |
| 2023/0253049 A1 * | 8/2023 | Lien | ...................... G11C 16/10 |
| | | | 365/189.011 |
| 2023/0317168 A1 * | 10/2023 | Park | .................. G11C 16/0425 |
| | | | 365/185.18 |
| 2023/0343400 A1 * | 10/2023 | Guo | ................... G11C 16/3459 |
| 2024/0029806 A1 * | 1/2024 | Guo | .................... G11C 16/102 |
| 2024/0055051 A1 * | 2/2024 | Yang | ...................... G11C 16/16 |
| 2024/0071529 A1 * | 2/2024 | Guo | ....................... G11C 16/08 |

* cited by examiner

| SB0 | SB1 | SB2 | SSSP | DSSP | DSSP+SSSP |
|-----|-----|-----|------|------|-----------|
| TP/P1/P2 | E/C | E/C | ○ | | |
| E | P1 | E | | ○ | |
| E | P2 | E | ○ | | |
| E | TP/P1/P2 | C | ○ | | |
| C | TP/P1/P2 | C | | | ○ |
| E | E | P1 | | ○ | |
| E | E | P2 | ○ | | |
| E/C | C | TP/P1/P2 | | ○ | |

TP: TO PROGRAM: TP
E: EMPTY
C: CLOSED
P1: CLOSED WL#<N
P2: CLOSED WL#>N

*FIG. 19*

PRECHARGE SCHEME DURING PROGRAMMING OF A MEMORY DEVICE

BACKGROUND

1. Field

The present disclosure is related generally to techniques for programming the memory cells of memory devices that include a plurality of memory blocks which are divided into sub-blocks.

2. Related Art

Semiconductor memory is widely used in various electronic devices, such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power, e.g., a battery.

NAND memory devices include a memory block with an array of memory cells arranged in a plurality of word lines and a plurality of channels. In some memory blocks, the word lines are divided into two or more sub-blocks that can be programmed and erased independently of one another. Within each sub-block, the word lines are programmed sequentially in a direction from one side of the sub-block to an opposite side of the sub-block. In many memory devices, in an effort to minimize program disturb, the word lines in an upper sub-block are programmed in a first direction from a source side of the sub-block towards a drain side of the sub-block, and the word lines in a lower sub-block are programmed in an opposite second direction from the drain side of the sub-block towards the source side of the sub-block.

SUMMARY

One aspect of the present disclosure is related to a method of programming a memory device. The method includes the step of preparing a memory device that includes at least one memory block. The at least one memory block has a source side and a drain side and includes a plurality of memory cells that are arranged in a plurality of word lines. The plurality of word lines are arranged in a plurality of sub-blocks, which are configured to be programmed and erased independently of one another. The method also includes the step of determining a location of a selected sub-block of the plurality of sub-blocks within the at least one memory block and a programming condition of at least one unselected sub-block of the plurality of sub-blocks. The method proceeds with the step of programming at least one word line in the selected sub-block in a plurality of program loops. The program loops include a pre-charging process, and the pre-charging process starts from either the source side or the drain side of the memory block based on at least one of the location of the selected sub-block within the at least one memory block and the programming condition of the at least one unselected sub-block.

According to another aspect of the present disclosure, the method further includes the step of sequentially programming the word lines of the selected sub-block of the plurality of sub-blocks in a direction from the drain side towards the source side regardless of the location of the selected sub-block within the memory block and regardless of the programming condition of the at least one unselected sub-block.

According to yet another aspect of the present disclosure, each program loop of the plurality of program loops includes a verify operation that includes applying a pass voltage VREAD to a plurality of unselected word lines in the memory block.

According to still another aspect of the present disclosure, at an end of the verify operation of each program loop, on only one side of a selected word line, at least some of the unselected word lines begin discharging from the pass voltage VREAD one after the other in a direction towards either the source side of the memory block or the drain side of the memory block.

According to a further aspect of the present disclosure, the side of the selected word line that the unselected word lines discharge one after the other is the same side of the selected word line that the pre-charging process starts at.

According to yet a further aspect of the present disclosure, prior to some of the unselected word lines completing discharging, a pre-charge voltage is applied to at least one of a source line on the source side of the memory block or a bit line on the drain side of the memory block to pre-charge at least one channel in the memory block prior to the completion of the discharging of some of the unselected word lines.

According to still a further aspect of the present disclosure, if the selected sub-block is a lower sub-block located on the source side of the memory block, then the pre-charging process starts from the source side of the memory block.

According to another aspect of the present disclosure, if the selected sub-block is an upper sub-block that is located on the drain side of the memory block and the at least one unselected sub-block is a closed sub-block, then the pre-charging process starts from the drain side of the memory block.

According to yet another aspect of the present disclosure, if the selected sub-block is an upper sub-block that is located on the drain side of the memory block and the at least one unselected sub-block is an open sub-block, then the method further includes the steps of determining a number of programmed word lines in the selected sub-block; comparing the number of programmed word lines in the selected sub-block to a threshold; if the number of programmed word lines in the selected sub-block is less than the threshold, then the pre-charging process starts from the drain side of the memory block; and if the number of programmed word lines in the selected sub-block is greater than the threshold, then the pre-charging process starts from the source side of the memory block.

Another aspect of the present disclosure is related to a memory device. The memory device includes at least one memory block. The at least one memory block has a source side and a drain side and includes a plurality of memory cells arranged in a plurality of word lines. The plurality of word lines are arranged in a plurality of sub-blocks that are configured to be programmed and erased independently of one another. The memory device also includes control circuitry that is configured to program the memory cells of a selected sub-block of the plurality of sub-blocks. The control circuitry is configured to determine a location of a selected sub-block of the plurality of sub-blocks within the at least one memory block and determine a programming condition of at least one unselected sub-block of the plurality of sub-blocks. The control circuitry is also configured to program at least one word line in the selected sub-block in a plurality of program loops. The program loops include pre-charging processes, and the control circuitry pre-charges a plurality of channels in the memory block from either the source side or the drain side of the memory block based on at least one of the location of the selected sub-block within the memory block and the programming condition of the at least one unselected sub-block.

According to another aspect of the present disclosure, the control circuitry is further configured to sequentially program the word lines of the selected sub-block of the plurality of sub-blocks in a direction from the drain side towards the source side of the memory block regardless of the location of the selected sub-block within the memory block and regardless of the programming condition of the at least one unselected sub-block.

According to yet another aspect of the present disclosure, each program loop of the plurality of program loops includes a verify operation that includes the control circuitry applying a pass voltage VREAD to a plurality of unselected word lines in the memory block.

According to still another aspect of the present disclosure, at an end of the verify operation of each program loop, on only one side of a selected word line, the control circuitry begins discharging at least some of the unselected word lines from the pass voltage VREAD one after the other in a direction towards either the source side of the memory block or the drain side of the memory block.

According to a further aspect of the present disclosure, the side that the unselected word lines begin discharging from the pass voltage VREAD one after another is the same side of the selected word line that the control circuitry pre-charges the plurality of channels from.

According to yet a further aspect of the present disclosure, prior to some of the unselected word lines completing discharging, the control circuitry applies a pre-charge voltage to at least one of a source line on the source side of the memory block or a bit line on the drain side of the memory block to pre-charge at least one channel in the memory block prior to the completion of the discharge process.

According to still a further aspect of the present disclosure, if the selected sub-block is a lower sub-block located on the source side of the memory block, then the control circuitry starts the pre-charging process from the source side of the memory block.

According to another aspect of the present disclosure, if the selected sub-block is an upper sub-block that is located on the drain side of the memory block and the at least one unselected sub-block is a closed sub-block, then the control circuitry starts the pre-charging process from the drain side of the memory block.

According to yet another aspect of the present disclosure, if the selected sub-block is an upper sub-block that is located on the drain side of the memory block and the at least one unselected sub-block is an open sub-block, then the control circuitry is further configured to determine a number of programmed word lines in the selected sub-block and compare the number of programmed word lines in the selected sub-block to a threshold. If the number of programmed word lines in the selected sub-block is less than the threshold, then the control circuitry pre-charges the plurality of channels from the drain side of the memory block. If the number of programmed word lines in the selected sub-block is greater than the threshold, then the control circuitry pre-charges the plurality of channels from the source side of the memory block.

Yet another aspect of the present disclosure is related to an apparatus. The apparatus includes at least one memory block. The at least one memory block has a source side and a drain side and includes a plurality of memory cells arranged in a plurality of word lines. The plurality of word lines are arranged in a plurality of sub-blocks that are configured to be programmed and erased independently of one another. The apparatus also includes a programming means for programming the memory cells of the at least one memory block to include at least three bits of data per memory cell. When programming a selected sub-block of the plurality of sub-blocks, the programming means is configured to determine a location of a selected sub-block of the plurality of sub-blocks within the at least one memory block and determine a programming condition of at least one unselected sub-block of the plurality of sub-blocks. The programming means is further configured to program a selected word line in the selected sub-block in a plurality of program loops. The program loops include programming pulses and verify operations. During each of the verify operations, the programming means applies a pass voltage VREAD to a plurality of unselected word lines. The programming means is further configured to begin discharging the unselected word lines on one side of a selected word line one after the other to remove electrons from a plurality of channels of the memory block on one side of the selected word line.

According to another aspect of the present disclosure, the programming means is further configured to pre-charge the plurality of channels of the memory block from the side of the selected word line that the programming means discharges the unselected word lines one after the other.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which:

FIG. 19 is a table that identifies which pre-charging option to select based on the conditions of three sub-blocks in a memory block.

DESCRIPTION OF THE ENABLING EMBODIMENTS

According to the present disclosure, a memory block is divided into a plurality of sub-blocks that can be programmed and erased independently of one another. During programming of a selected sub-block, regardless of the sub-block's location within a memory block, the word lines are programmed sequentially in a reverse order programming direction, i.e., from a drain side to a source side of the memory block. Programming of each word line includes a plurality of program loops, each with a program pulse and a verify operation. At an end of each verify operation, a plurality of unselected word lines on one side of a selected word line begin discharging from a pass voltage sequentially from a word line immediately adjacent the selected word line towards either the drain side or the source side of the memory block to remove electrons from a plurality of channels of the memory block on that side of the selected word line. The side of the selected word line that the word lines sequentially begin discharging is selected based on at least one of a location of the selected sub-block within the memory block and on the programming condition(s) of the unselected sub-block(s) of the memory device to optimize performance of the memory device.

Figures 1A, 1B:
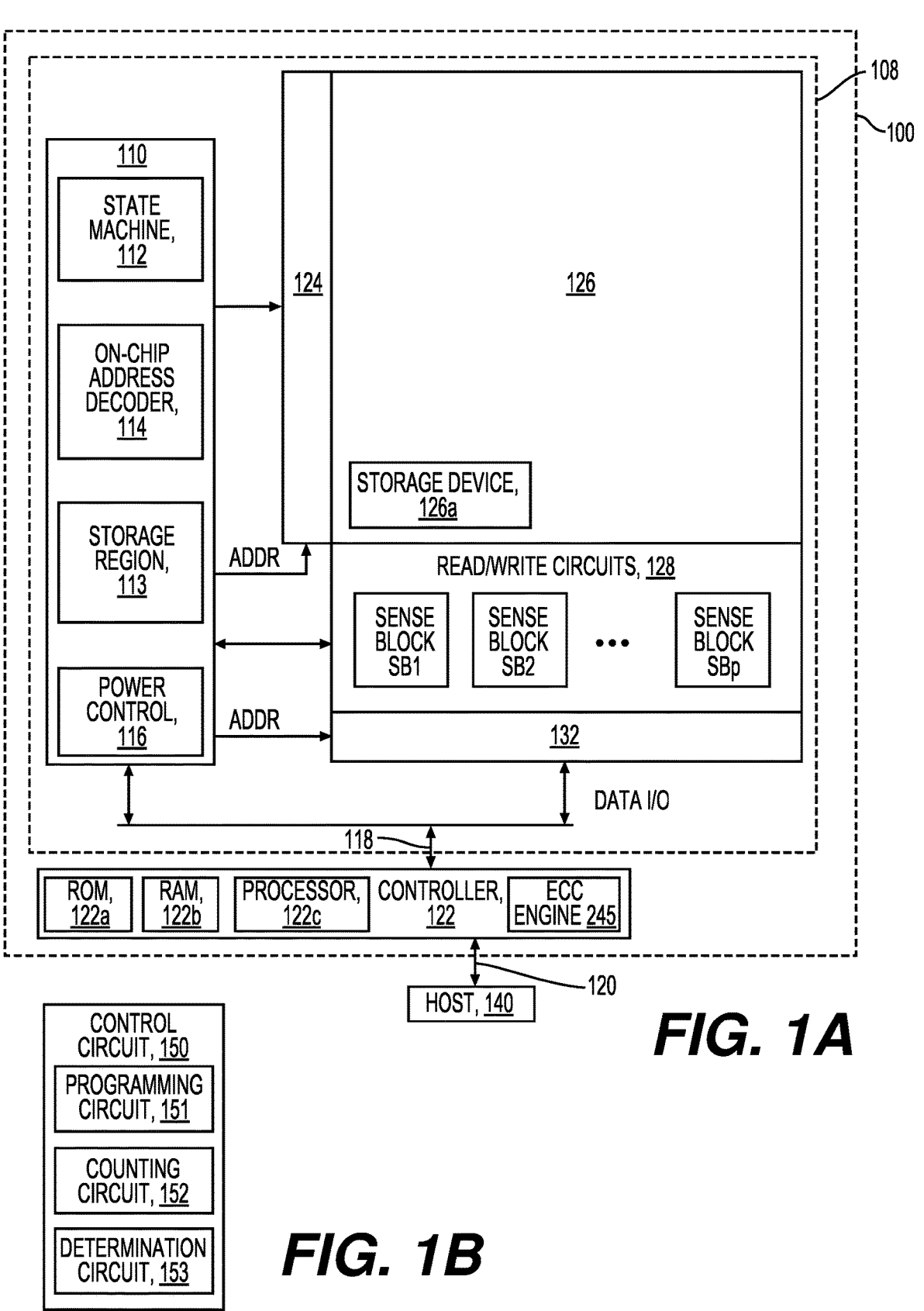
FIG. 1A is a block diagram of an example memory device.
FIG. 1B is a block diagram of an example control circuit.

FIG. 1A is a block diagram of an example memory device 100 that is configured to perform the aforementioned programming techniques. The memory device 100 includes a memory die 108 with a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller 122 and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one selected word line after which the programming circuit applies a verification signal to the selected word line. The control circuits can also include a counting circuit configured to obtain a count of memory cells which pass a verify test for the one data state. The control circuits can also include a determination circuit configured to determine, based on an amount by which the count exceeds a threshold, if a programming operation is completed.

For example, FIG. 1B is a block diagram of an example control circuit 150 that comprises a programming circuit 151, a counting circuit 152, and a determination circuit 153.

The off-chip controller 122 may comprise a processor 122*c*, storage devices (memory) such as ROM 122*a* and RAM 122*b* and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122*a*, 122*b* comprise, code such as a set of instructions, and the processor 122*c* is operable to execute the set of instructions to provide the functionality described herein. Alternately or additionally, the processor 122*c* can access code from a storage device 126*a* of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122*c* fetches the boot code from the ROM 122*a* or storage device 126*a* for execution, and the boot code initializes the system components and loads the control code into the RAM 122*b*. Once the control code is loaded into the RAM 122*b*, it is executed by the processor 122*c*. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
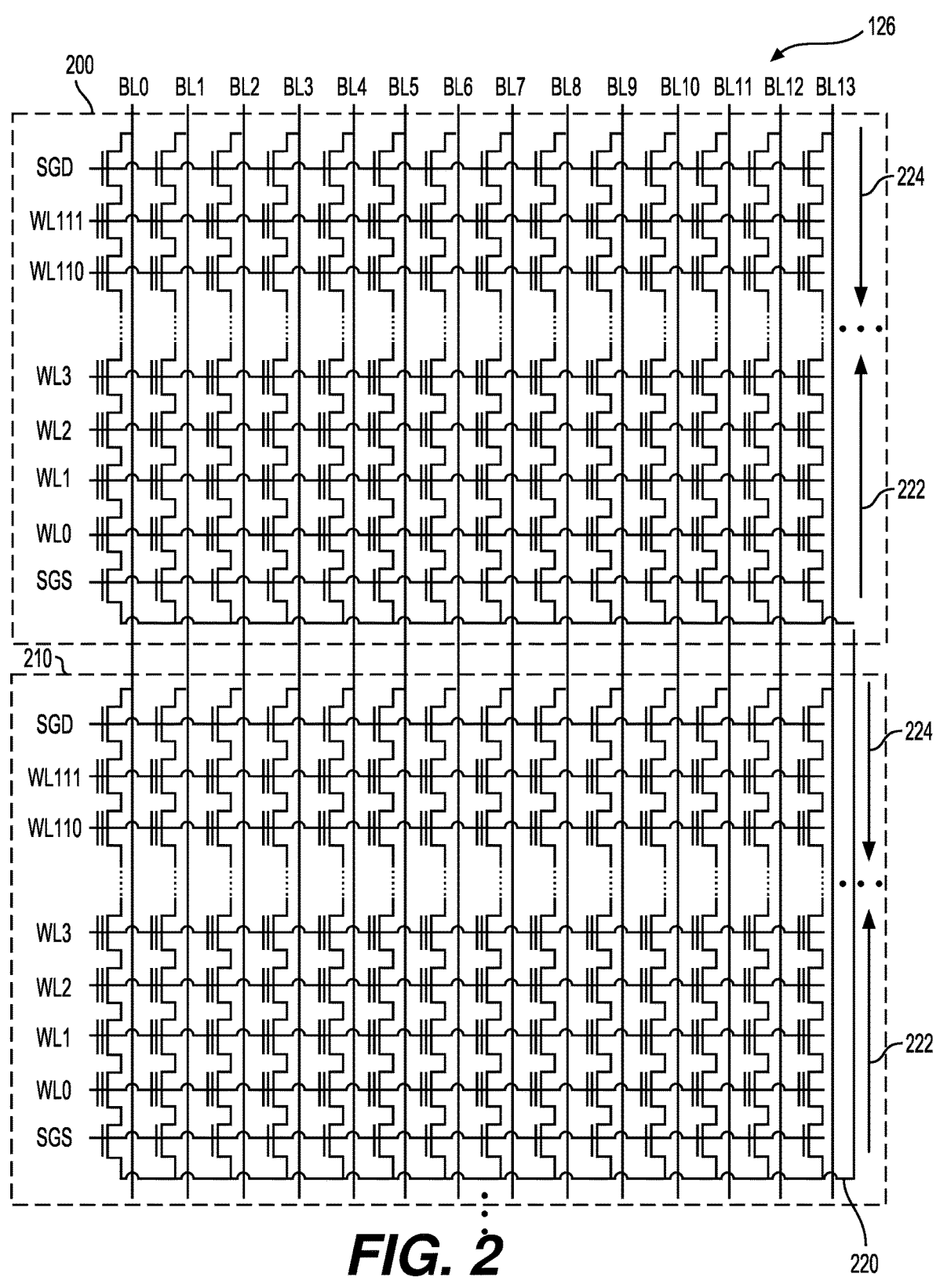
FIG. 2 depicts blocks of memory cells in an example two-dimensional configuration of the memory array of FIG. 1A.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. One hundred and twelve word lines, for example, WL0-WL111, extend between the SGSs and the SGDs. In some embodiments, the memory block may include more or fewer than one hundred and twelve word lines. For example, in some embodiments, a memory block includes one hundred and sixty-four word lines. In some cases, dummy word lines, which contain no user data, can also be used in the memory array adjacent to the select gate transistors. Such dummy word lines can shield the edge data word line from certain edge effects.

Figure 3A:
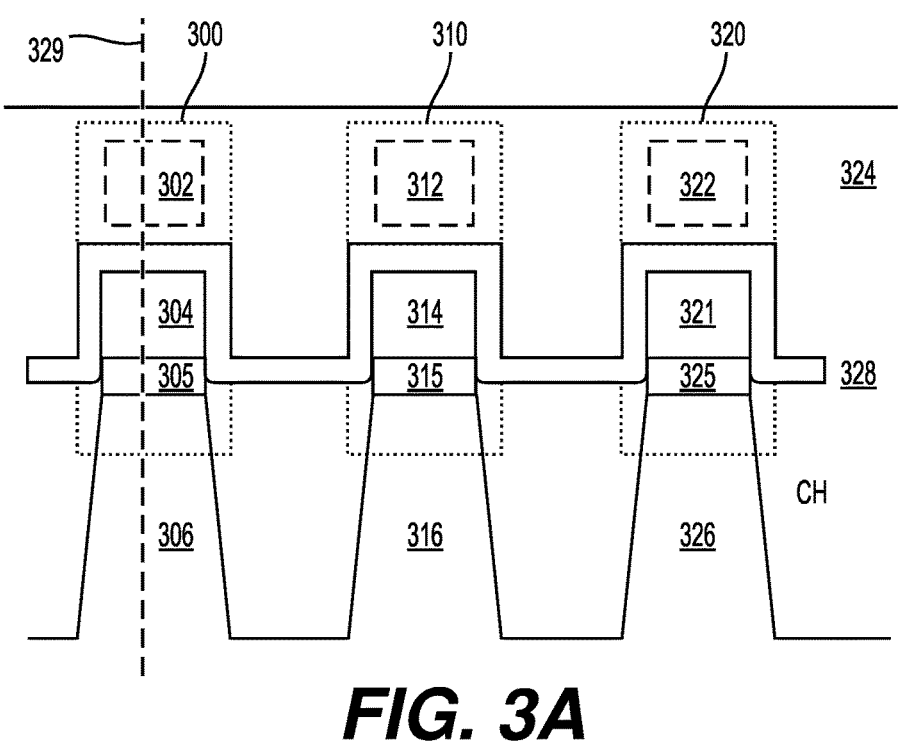
FIG. 3A and FIG. 3B depict cross-sectional views of example floating gate memory cells in NAND strings.
Figure 3B:
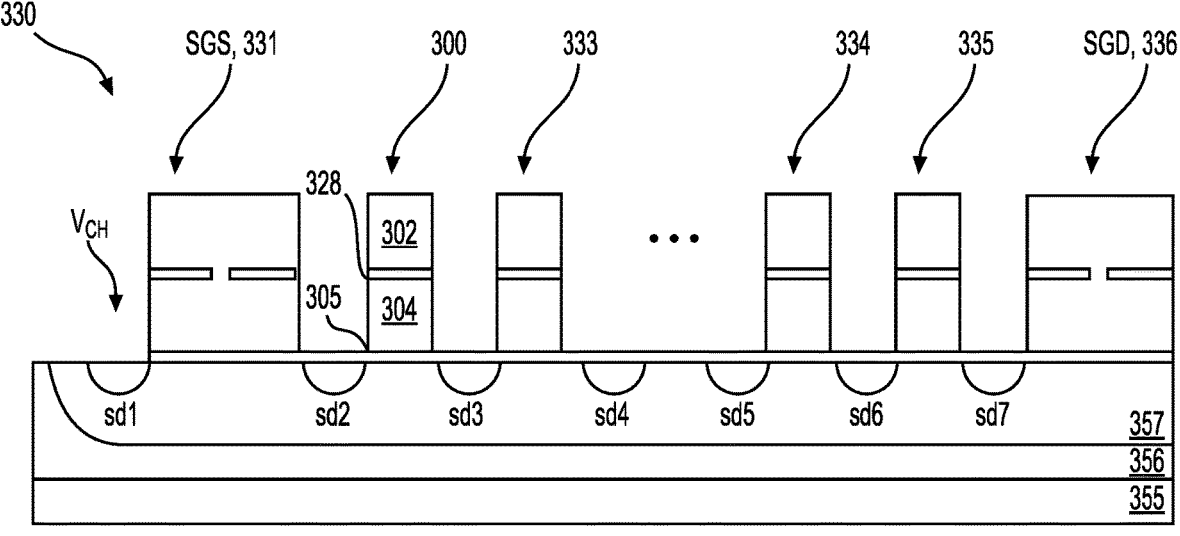

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
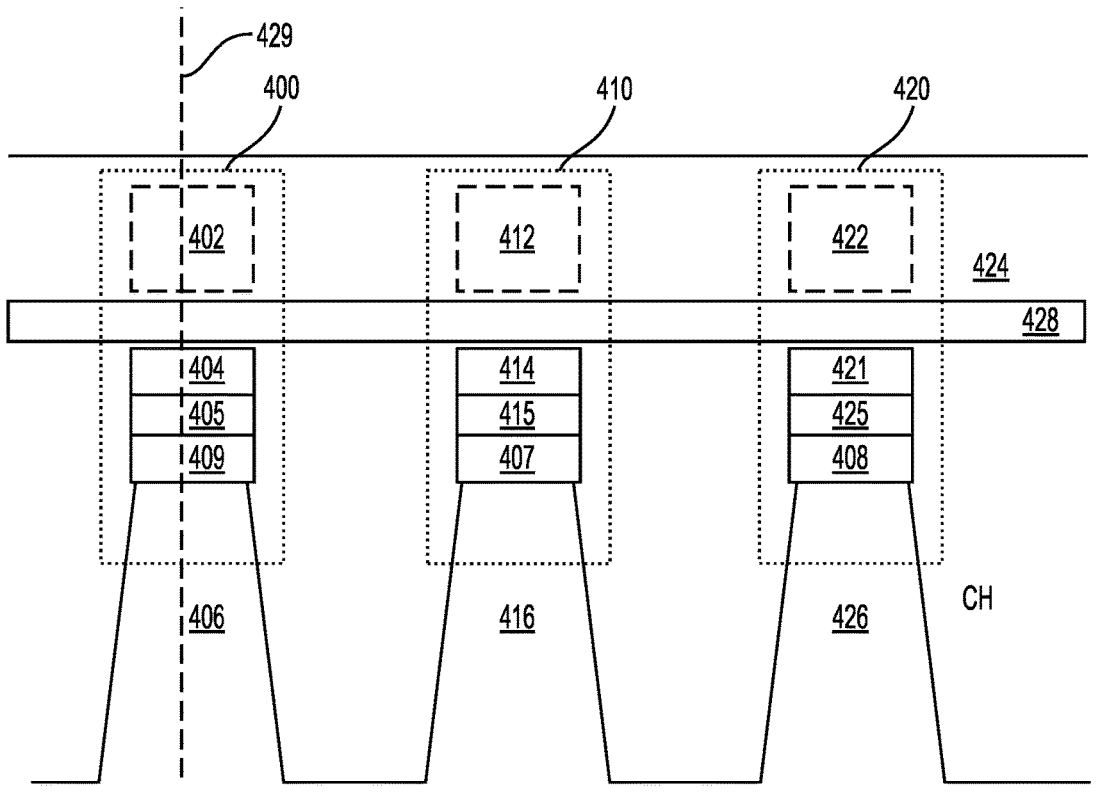
FIG. 4A and FIG. 4B depict cross-sectional views of example charge-trapping memory cells in NAND strings.
Figure 4B:
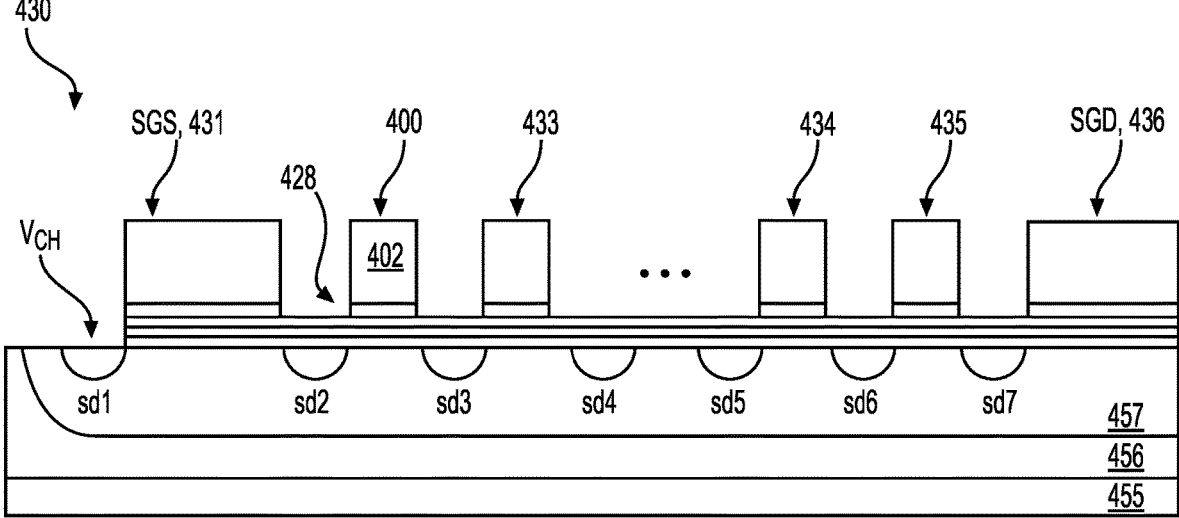

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
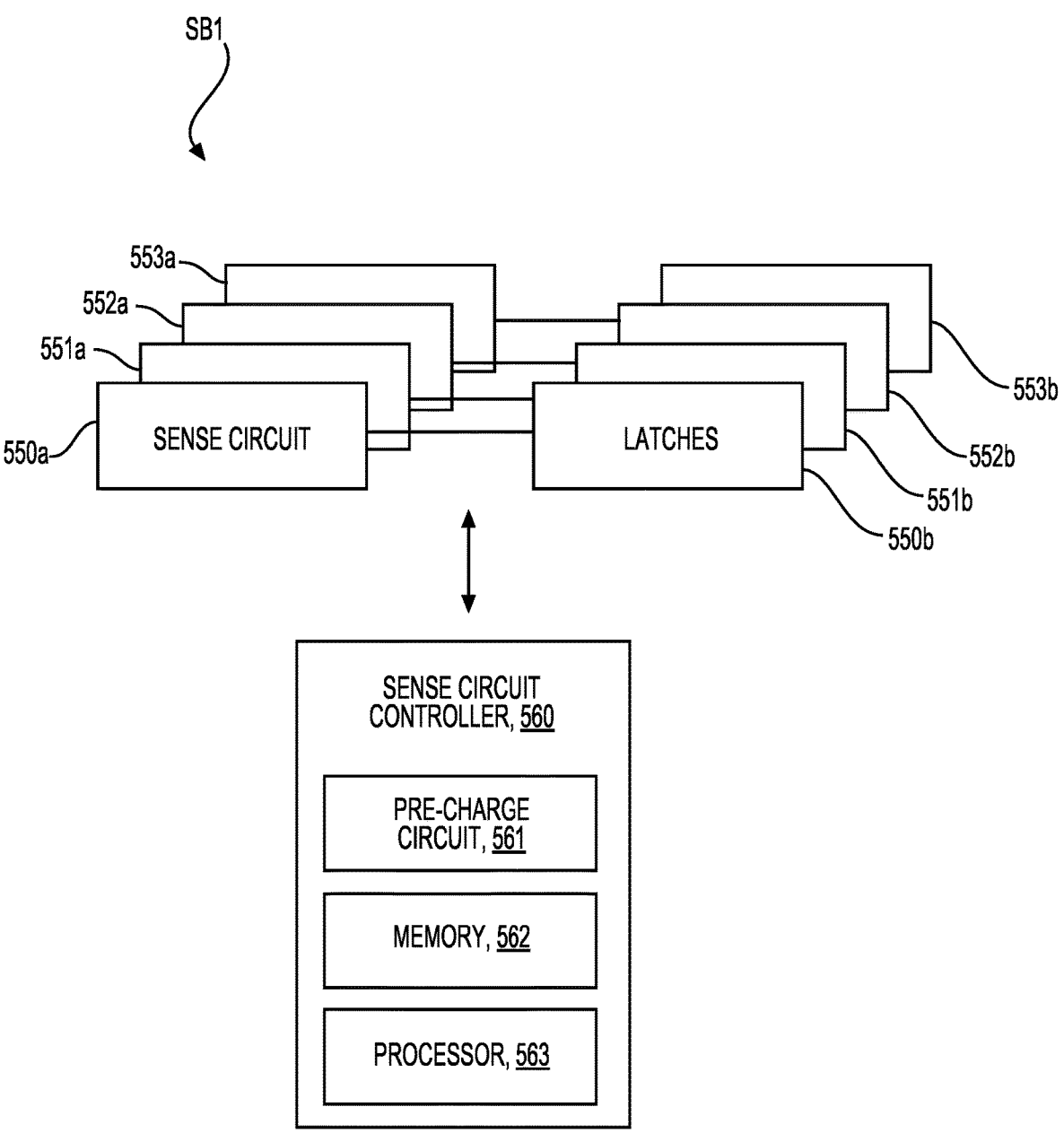
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
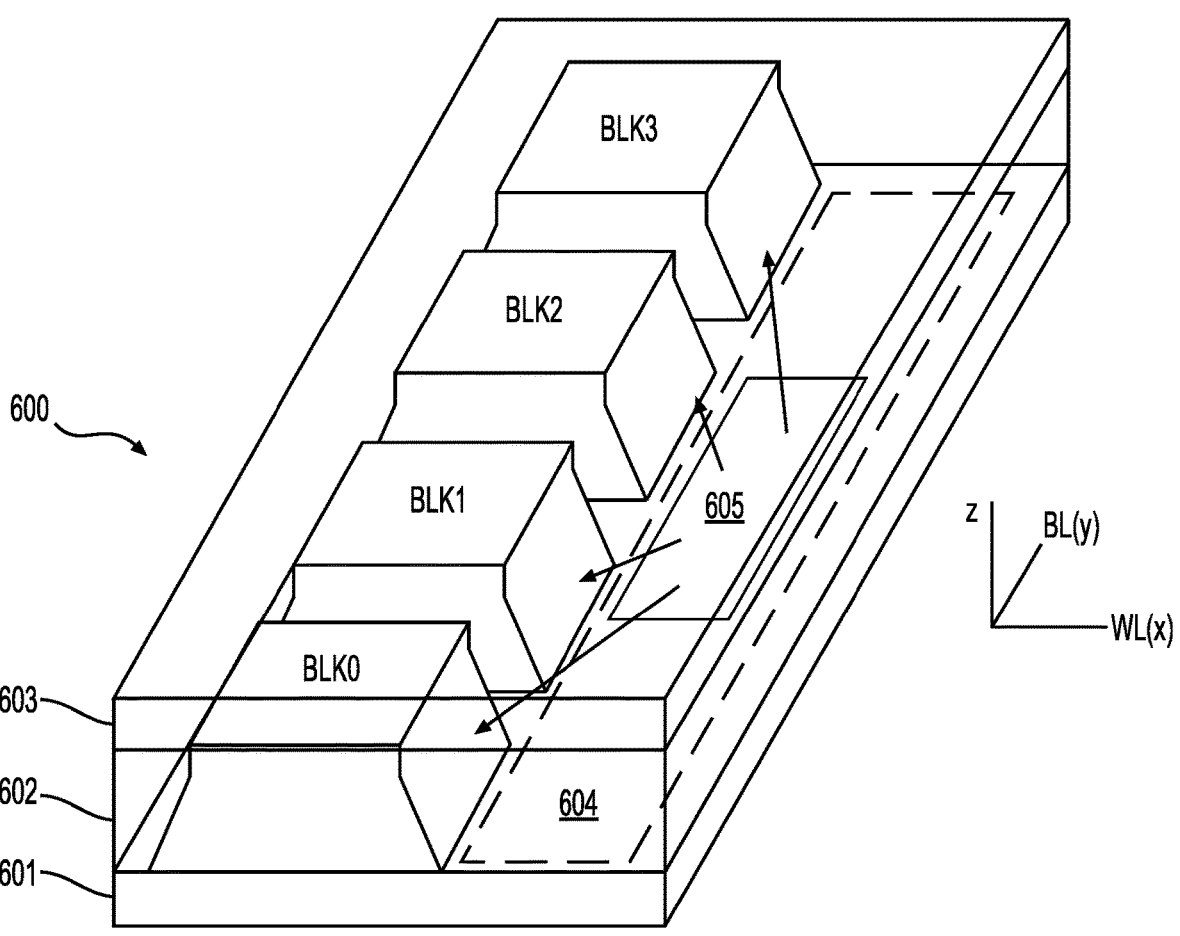
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
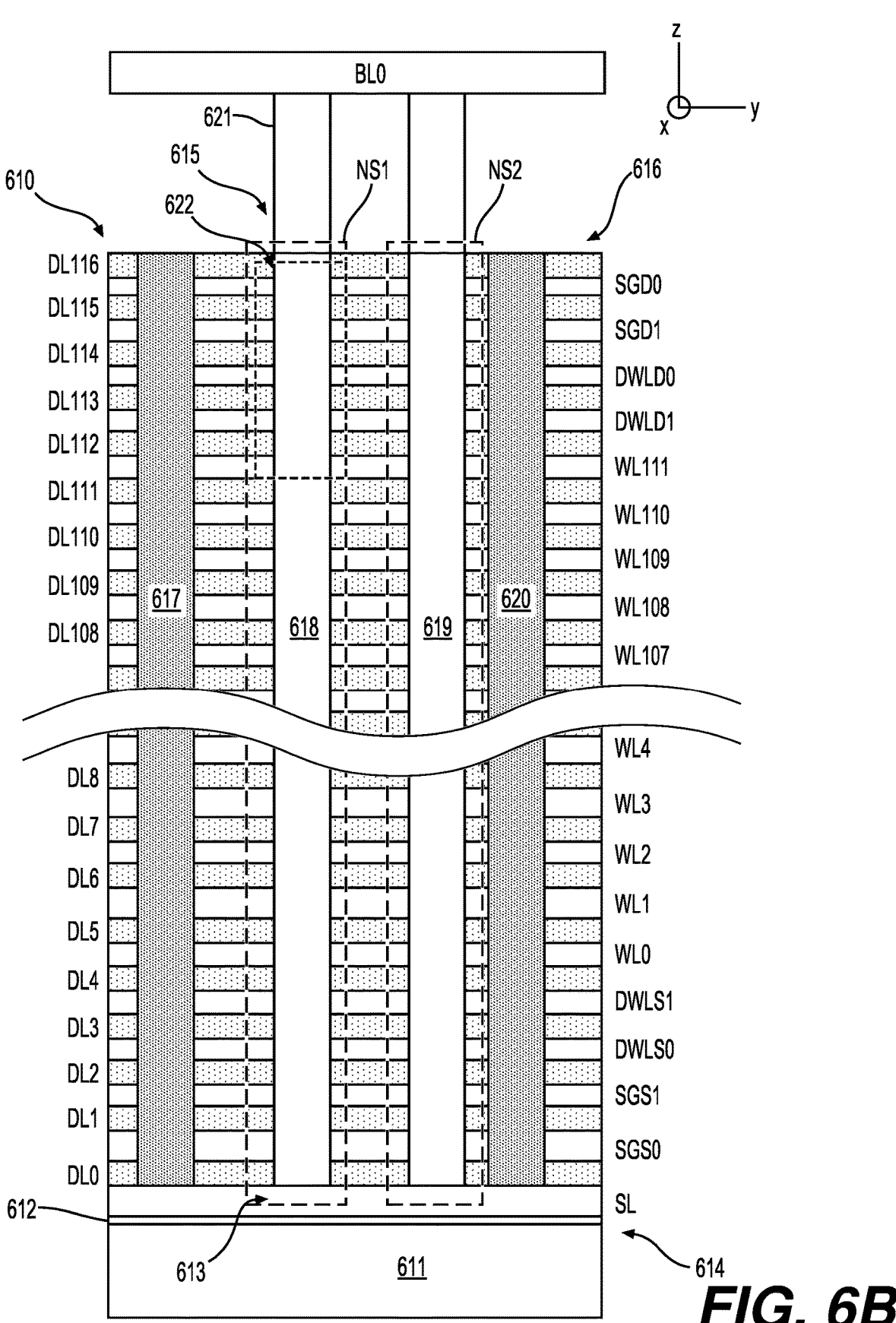
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WL0-WL111. The dielectric layers are labelled as DL0-DL116. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
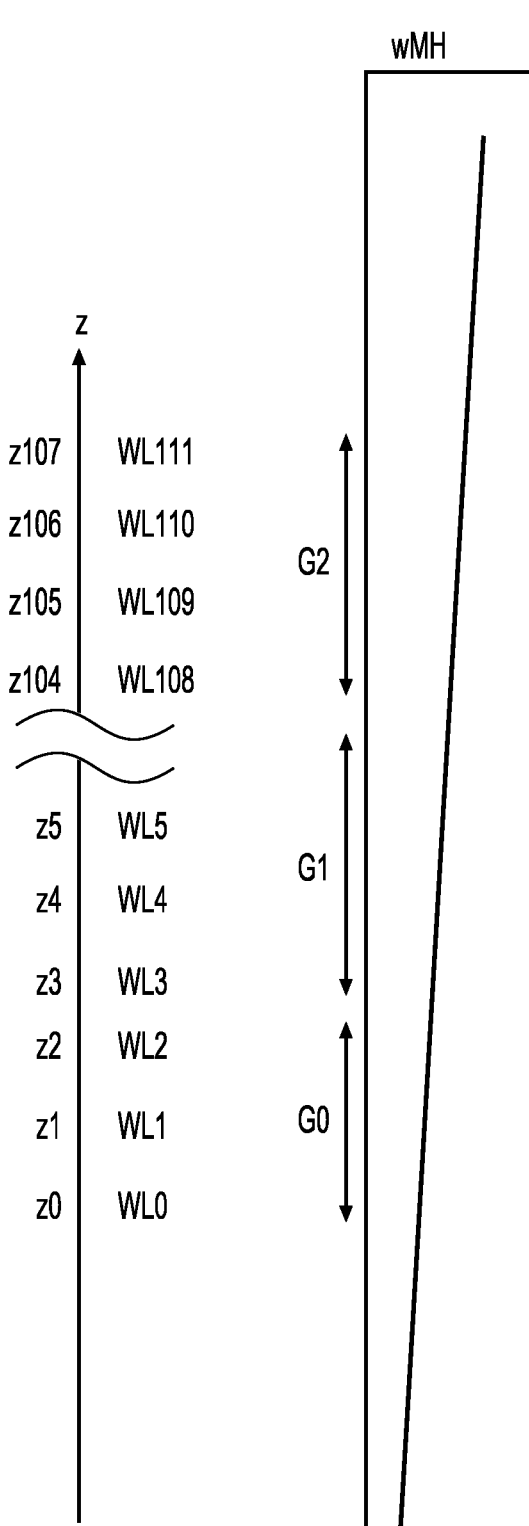
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WL0-WL111 of FIG. 6A are repeated as an example and are at respective heights z0-z111 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
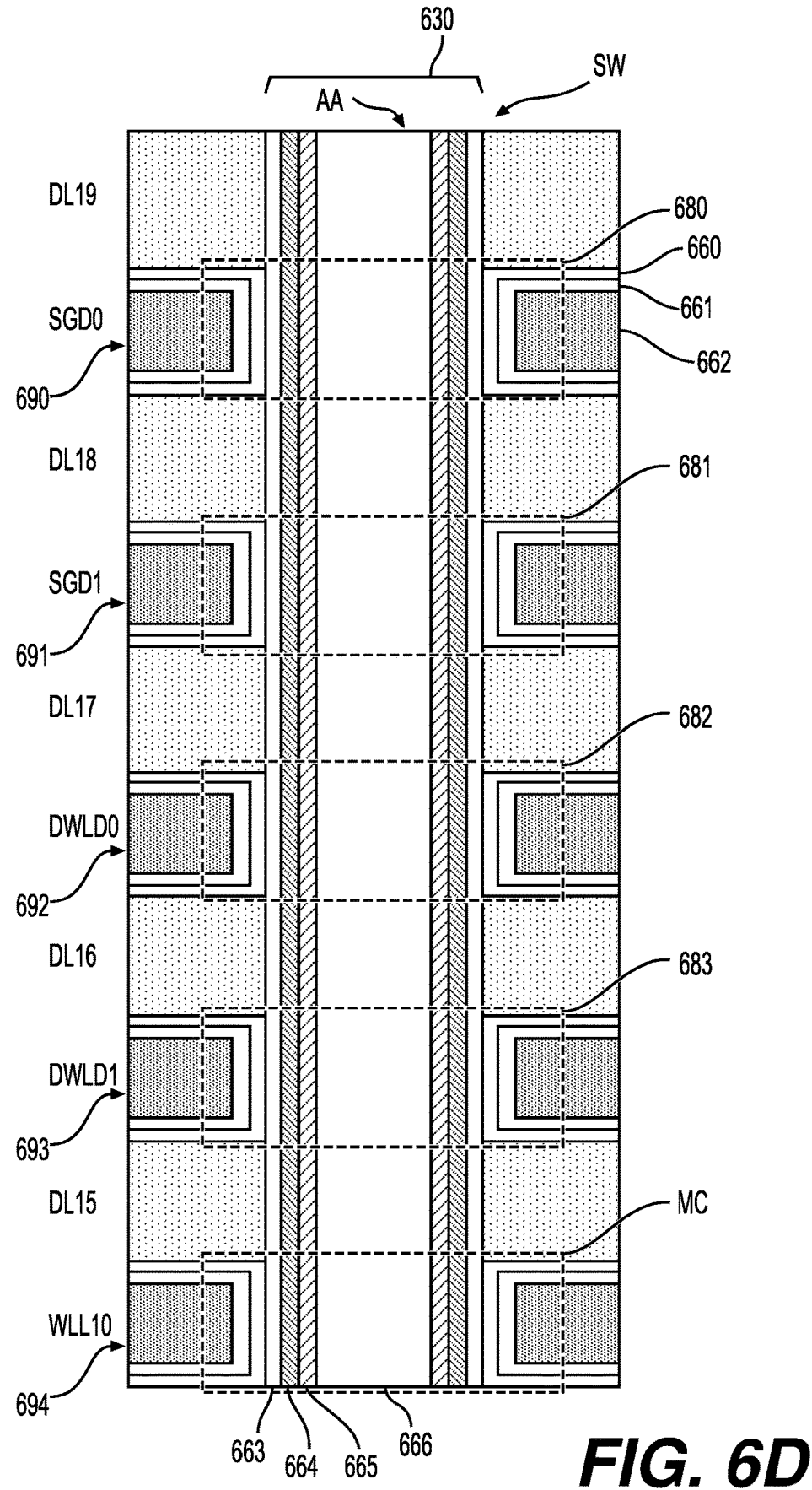
FIG. 6D depicts a close-up view of region 622 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figures 7A, 7B:
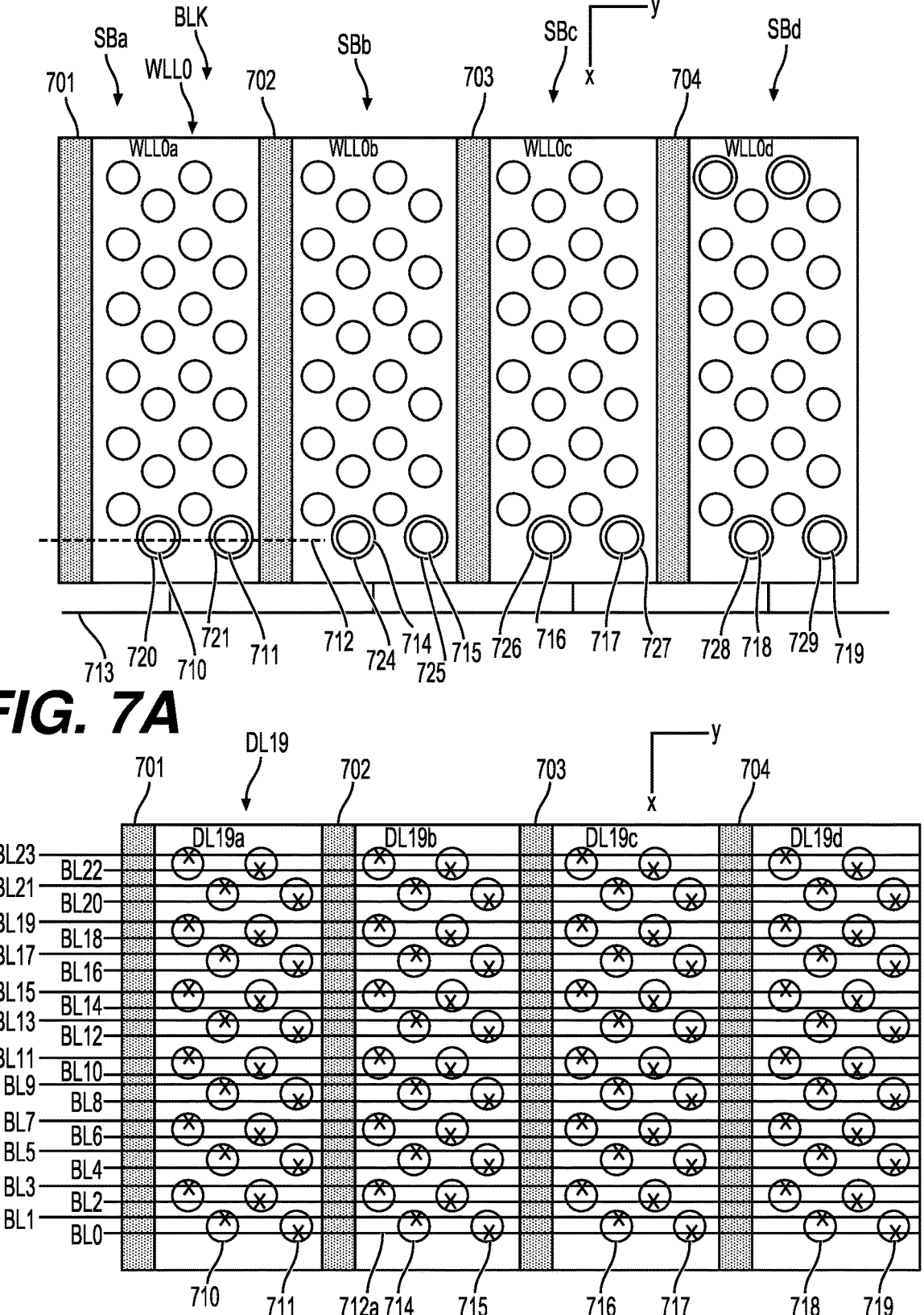
FIG. 7A depicts a top view of an example word line layer WLL0 of the stack of FIG. 6B.
FIG. 7B depicts a top view of an example top dielectric layer DL116 of the stack of FIG. 6B.

FIG. 7A illustrates a top view of an example word line layer WL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

As discussed in further detail below, a block BLK in a three-dimensional memory device can be divided into sub-blocks, where each sub-block comprises a NAND string group which has a common SGD control line. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WL0a, WL0b, WL0c and WL0d which are each connected by a contact line 713. The last region of a word line layer in a block can be connected to a first region of a word line layer in a next block, in one approach. The contact line 713, in turn, is connected to a voltage driver for the word line layer. The region WL0a has example memory holes 710, 711 along a contact line 712. The region WL0b has example memory holes 714, 715. The region WL0c has example memory holes 716, 717. The region WL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 720, 721 are in WL0a, memory cells 724, 725 are in WL0b, memory cells 726, 727 are in WL0c, and memory cells 728, 729 are in WL0d. These memory cells are at a common height in the stack.

Contact line connectors (e.g., slits, such as metal-filled slits) 701, 702, 703, 704 may be located between and adjacent to the edges of the regions WL0a-WL0d. The contact line connectors 701, 702, 703, 704 provide a conductive path from the bottom of the stack to the top of the stack. For example, a source line at the bottom of the stack may be connected to a conductive line above the stack, where the conductive line is connected to a voltage driver in a peripheral region of the memory device.

FIG. 7B illustrates a top view of an example top dielectric layer DL116 of the stack of FIG. 6B. The dielectric layer is divided into regions DL116a, DL116b, DL116c and DL116d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL116a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719.

Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL116 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figures 8, 9:
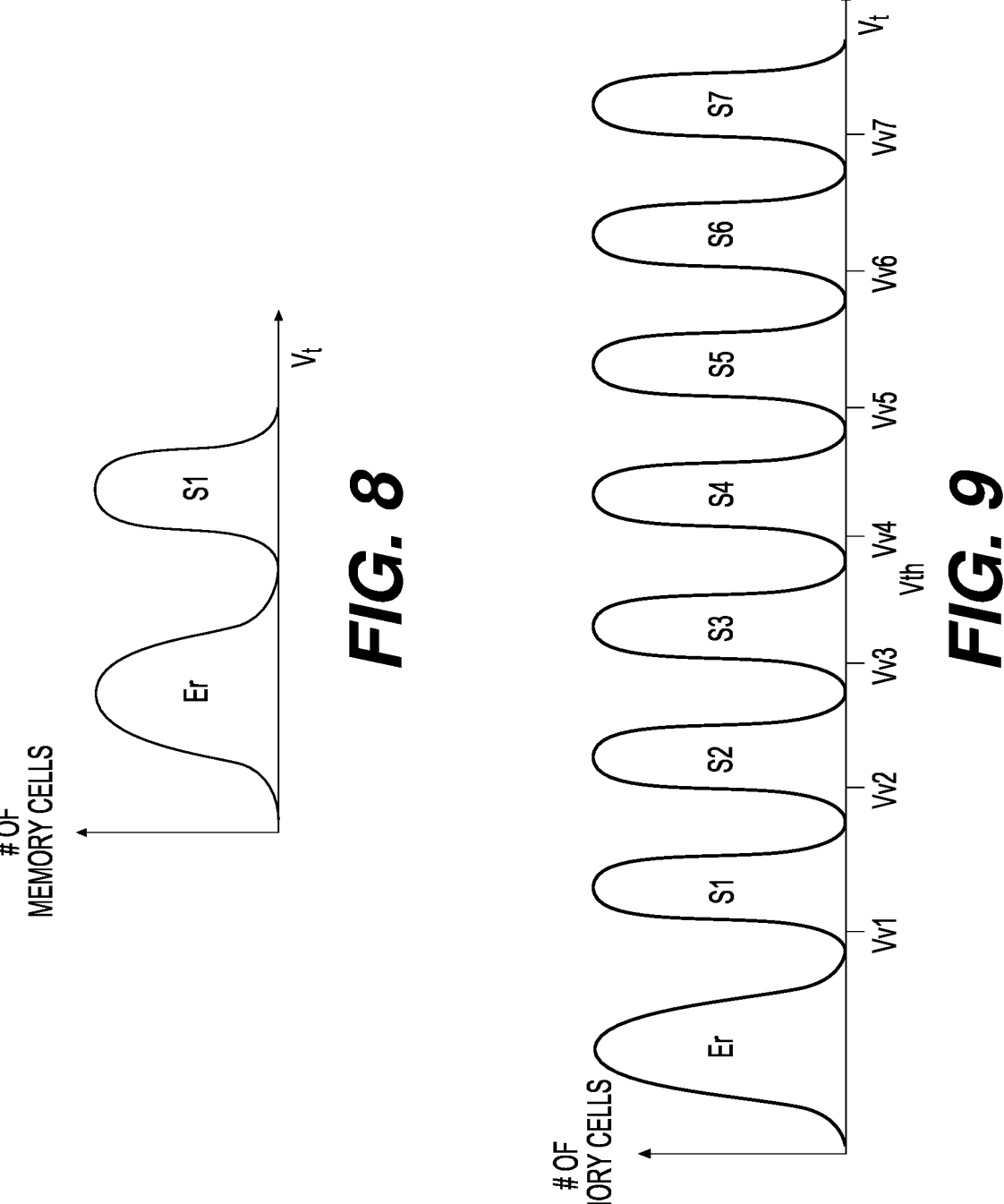
FIG. 8 is a threshold voltage distribution plot of a plurality of memory cells programmed to one bit per memory cell (SLC)
FIG. 9 is a threshold voltage distribution plot of a plurality of memory cells programmed to three bits per memory cell (TLC)

The memory cells of the memory blocks can be programmed to store one or more bits of data in multiple data states that are associated with respective threshold voltages Vt. For example, FIG. 8 depicts a threshold voltage Vt distribution of a group of memory cells programmed according to a one bit per memory cell (SLC) storage scheme. In the SLC storage scheme, there are two total data states, including the erased state (Er) and a single programmed data state (S1). FIG. 9 illustrates the threshold voltage Vt distribution of a three bits per cell (TLC) storage scheme that includes eight total data states, including the erased state (Er) and seven programmed data states (S1, S2, S3, S4, S5, S6, and S7). Each programmed data state (S1-S7) is associated with a respective verify voltage (Vv1-Vv7), which is employed during a verify portion of a programming operation to verify if a memory cell being programmed has reached the threshold voltage Vt of its intended data state. As illustrated, the verify voltages (Vv1-Vv7) of the respective data states get increasingly higher from the first data state S1 to the last data state S7. Other storage schemes are also available, such as two bits per cell (MLC) with four data states, four bits per cell (QLC) with sixteen data states, or five bits per cell (PLC) with thirty-two data states.

A programming operation starts with the memory cells of a selected word line being in the erased data state. Next, in at least one program loop, a programming voltage VPGM is applied to a control gate of the selected word line. The bit lines coupled to the memory cells of the selected word line can be left at a low voltage, such that electrons can migrate into the charge trapping materials of the memory cell coupled therewith, thereby raising the threshold voltages Vt of those memory cells. Alternately, the bit lines can be held at an elevated inhibit voltage to raise the voltages in the channels coupled therewith and inhibit programming of the memory cell by preventing electron migration into charge trapping materials of the memory cells coupled therewith.

Figure 10:
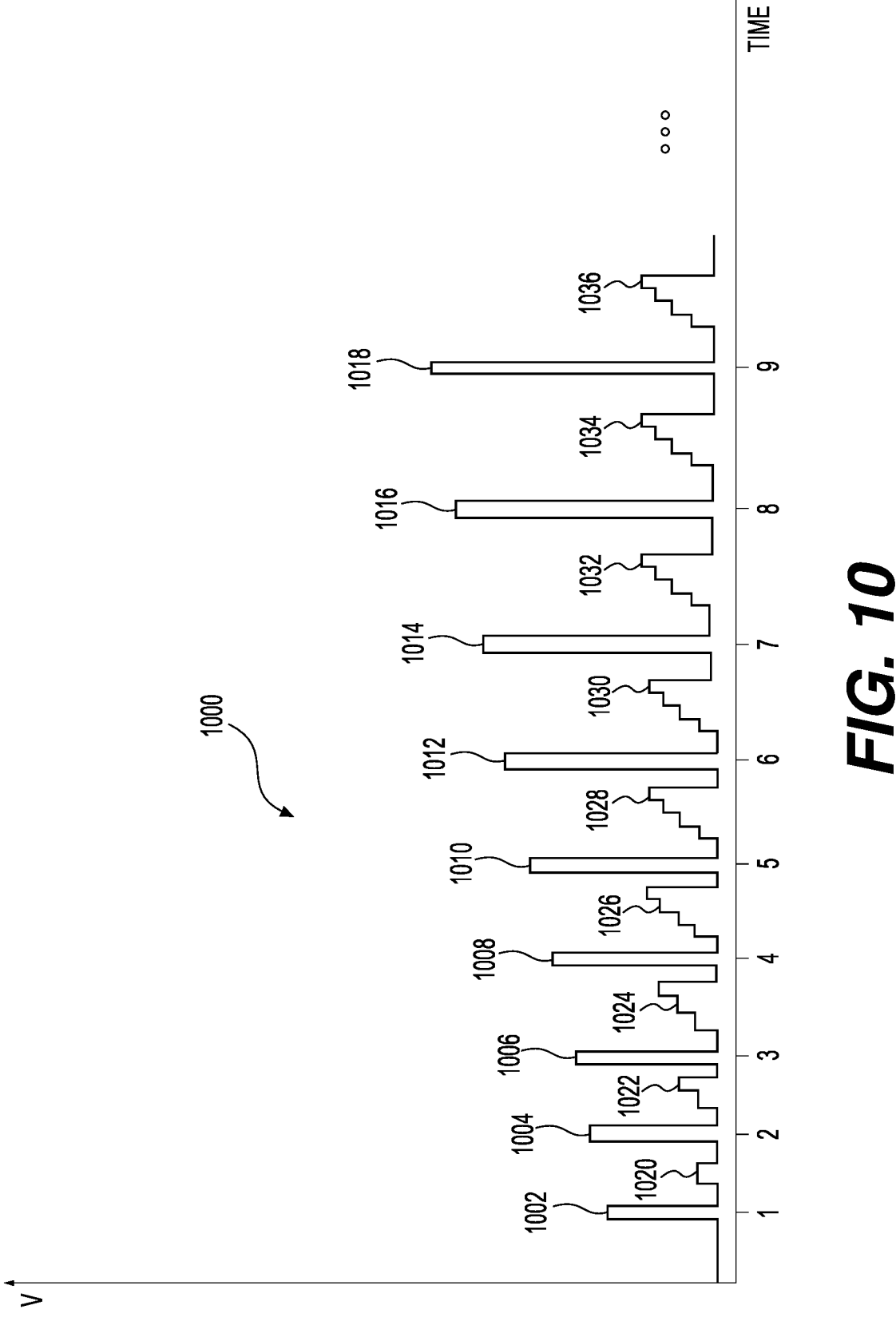
FIG. 10 is an example waveform of the voltages applied to a selected word line during an example programming operation that includes a plurality of program loops.

Programming to SLC (illustrated in FIG. 8) typically includes only a single programming pulse at a programming voltage VPGMSLC, whereas programming to MLC, TLC, or QLC typically includes a plurality of programming pulses that are applied in a plurality of program loops. FIG. 10 depicts a waveform 1000 of the voltages applied to a selected word line during an example memory cell programming operation for programming the memory cells of the selected word line to a greater number of bits per memory cell (e.g., TLC or QLC). As depicted, each program loop includes a programming pulse VPGM and one or more verify pulses, depending on which data states are being programmed in a particular program loop. A square waveform is depicted for each pulse for simplicity; however, other shapes are possible, such as a multilevel shape or a ramped shape.

Incremental Step Pulse Programming (ISPP) is used in this example pulse train, which means that the VPGM pulse amplitude steps up, or increases, in each successive program loop until programming of the word line is completed. In other words, the pulse train includes VPGM pulses that increase stepwise in amplitude with each program loop using a fixed step size (dVPGM). A new pulse train starts at an initial VPGM pulse level VPGMU and ends at a final VPGM pulse level, which does not exceed a maximum allowed level. The pulse train 1000 includes a series of VPGM pulses 1001-1015 that are applied to a selected word line that includes a set of non-volatile memory cells. One or more verify voltage pulses 1016-1029 are provided after each VPGM pulse as an example, based on the target data states which are being verified in the given program loop. The verify voltages correspond with the voltages Vv1-Vv7 (shown in FIG. 9). Concurrent with the application of the verify voltages, a sensing operation can determine whether a particular memory cell in the selected word line has a Vt above the associated verify voltage by sensing a current through a memory cell of the selected word line. If the current is relatively high, this indicates the memory cell is in a conductive state, and its threshold voltage Vt is less than the verify voltage being applied to the selected word line at that moment. If the current is relatively low, this indicates the memory cell is in a non-conductive state and its threshold voltage Vt is above the verify voltage being applied at that moment. If a memory cell passes verify, programming of that memory cell is inhibited for all remaining programming loops. Programming proceeds until all memory cells pass verify for their intended data states, in which case, programming succeeds, or until a predetermined maximum number of program loops is exceeded, in which case, programming fails.

Referring back to FIG. 2, the word lines of a memory block are programmed in a sequential order, or programming sequence, which can proceed in two different and opposite directions. One direction, indicated with the arrow 222, is a normal order programming (NOP) direction whereby the word lines are programmed, in sequence, from one end of the memory block to the other end, starting from a source side of the memory block and proceeding towards a drain side of the memory block. The other direction is a reverse order programming (ROP) direction, which is indicated with the arrow 224. In a ROP programming sequence, programming starts from the drain side of the memory block and proceeds, sequentially, towards the source side.

In some memory blocks, when data stored therein is no longer needed, before new data can be programmed to the memory cells, all of the memory cells in that memory block must first be erased together. This becomes cumbersome as the number of word lines in a memory block increases, and therefore, in some memory devices, the memory blocks are sub-divided into two or more sub-blocks. For example, in the embodiments of FIGS. 17A-E and 18 (discussed in further detail below), the memory block has been divided into two sub-blocks, namely a lower sub-block SB0 and an upper sub-block SB1. In the exemplary embodiment, the adjacent sub-blocks SB0, SB1 are separated from one another by a joint, which consists of a plurality of dummy word lines that do not contain data. The lower and upper sub-blocks SB0, SB1 can be programmed and erased independently of one another. In some embodiments, a memory block may be divided into more than two sub-blocks, i.e., three or more sub-blocks.

Figure 11:
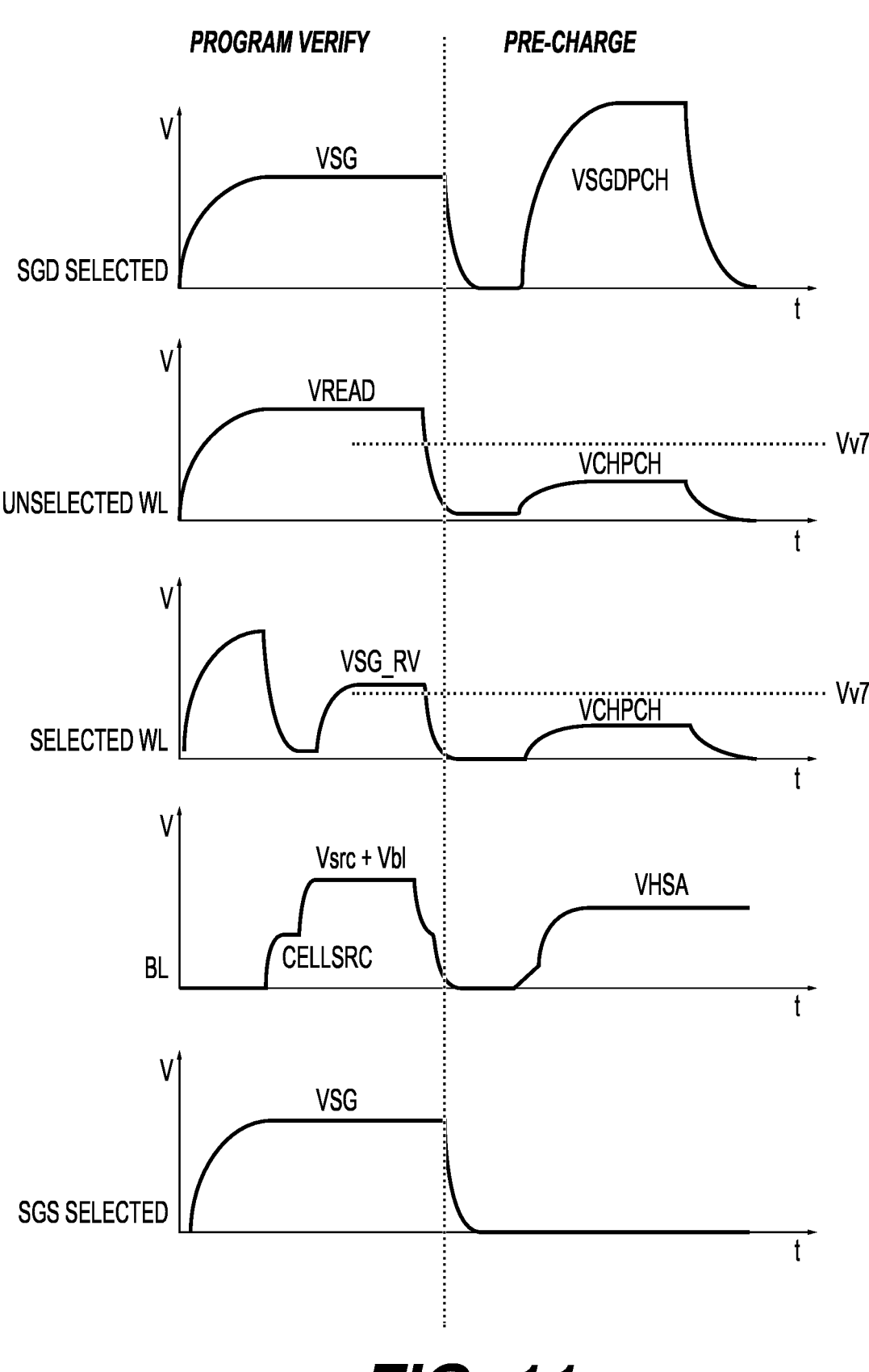
FIG. 11 illustrates the voltage waveforms of a plurality of components of an example memory device during a portion of an example program loop.

Prior to each programming pulse, the channels containing the memory cells to be programmed may be pre-charged or boosted by applying a small voltage to all of the word lines in a memory block to open the channels. FIG. 11 depicts the voltages applied to various components of a memory block during a program-verify operation of one program loop and a pre-charge operation of the following loop. As illustrated, at the end of the verify operation in this example, the voltages applied to the control gates of all word lines (both the selected word line and the unselected word lines) ramp down simultaneously. Next, during the pre-charge operation, a pre-charge voltage VCHPCH is applied to the control gates of all word lines of the memory block, including both the selected word line and the unselected word lines. Simultaneously, a greater CELSRC voltage (which is approximately two Volts in some embodiments) is applied to the source line to clean the channel and charge the channel to approximately the CELSRC voltage level. Pre-charging the channel mitigates the occurrence of program disturb (unintentional programming) in memory cells being inhibited during the following programming loop.

Figure 12:
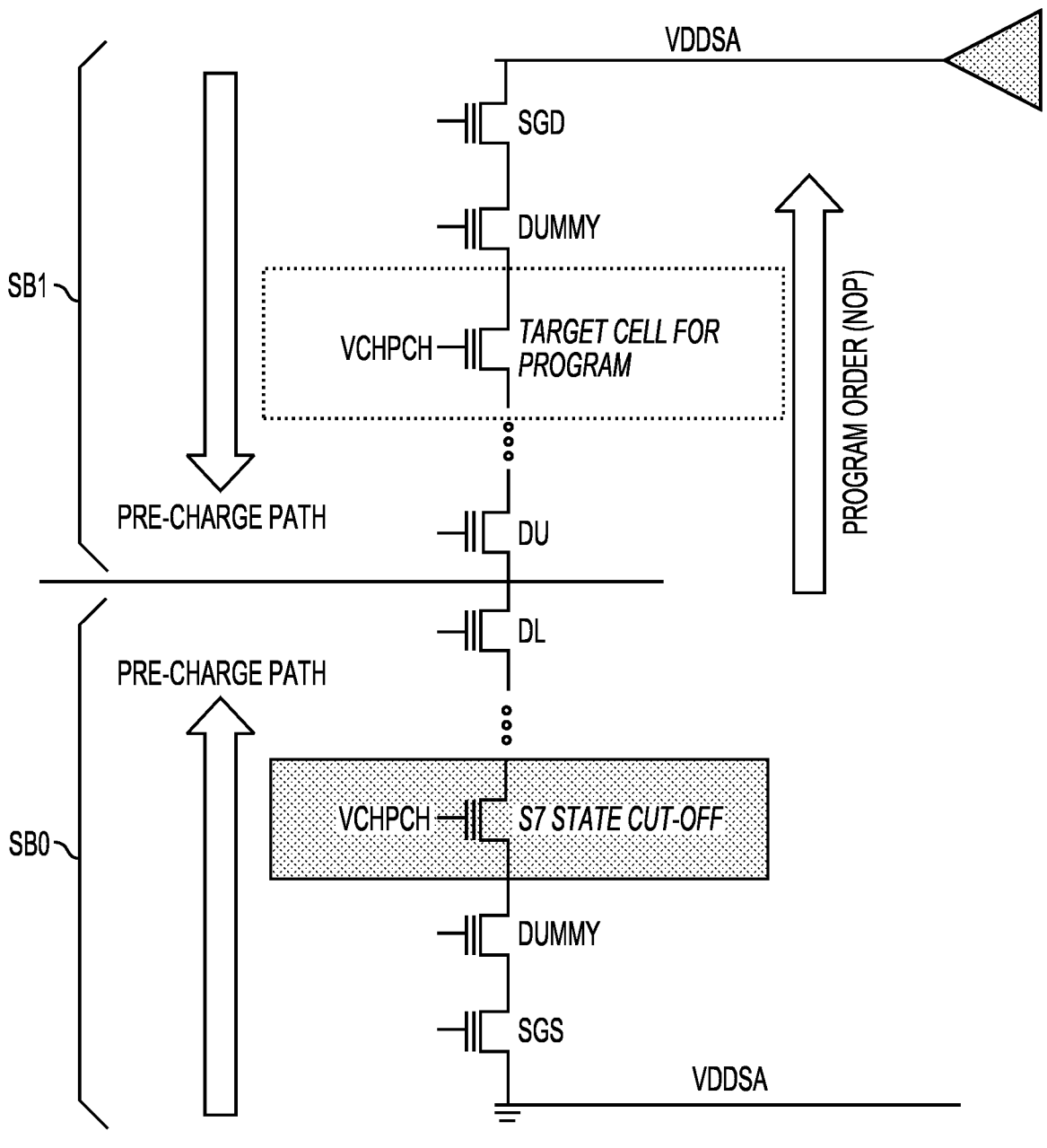
FIG. 12 is a schematic view of an example string during an example pre-charging process.
Figure 13:
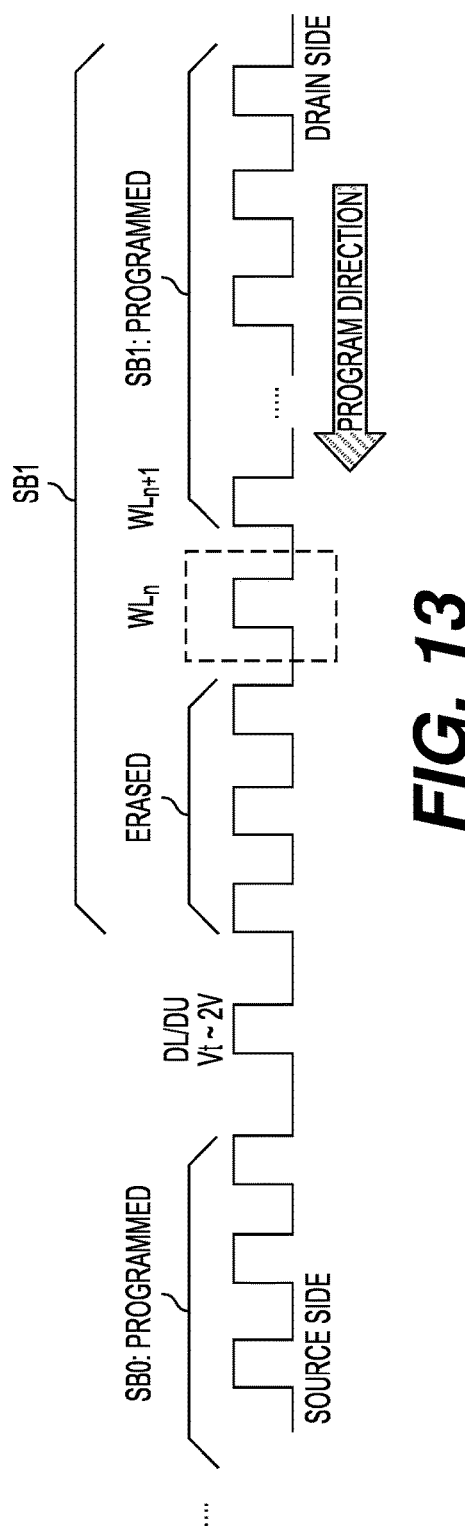
FIG. 13 is a schematic view of an example string during an example pre-charging process according to an aspect of the present disclosure.

A pre-charge issue may exist when a memory block is operating in a sub-block mode and when the word lines of an unselected sub-block of the same memory block are already programmed. This issue is particularly problematic if the memory cells of the unselected sub-block are programmed to a three or more bits per memory cell program scheme, such as TLC or QLC. As illustrated in FIG. 12, in such cases, it may be difficult to pre-charge some channels in the unselected sub-block, particularly the channels that contain memory cells programmed to high data states, e.g., the S7 data state in the case of TLC. This occurs because the verify voltage Vv7 of the S7 data state may be greater than the pre-charge voltage VCHPCH such that the memory cell may not be "turned on" by the pre-charge voltage VCHPCH. For example, FIG. 13 schematically depicts a pre-charge operation applied to a single string in a memory block that includes two sub-blocks: a lower sub-block SB0 and an upper sub-block SB1. In this figure, a word line in the upper sub-block SB1 is being programmed, and the lower sub-block SB0 is already fully programmed. The pre-charge voltage VCHPCH is applied to all word lines in the memory block. As illustrated, one of the memory cells in the lower sub-block SB0 is not turned on by the pre-charge voltage VCHPCH. Therefore, the cell source voltage from the source line beneath the lower sub-block SB0 is not able to get past the memory cell in the S7 data state and reach the selected word line. Further, as the unselected word lines ramp-down from a pass voltage VREAD during the program-verify operation (see FIG. 11), once the voltage drops below the verify voltage of a memory cell (for example, Vv7 for a memory cell in the S7 data state), that memory cell will be "turned off" such that they cannot conduct current, thereby leaving the rest of the channel floating at a negative voltage. If the pre-charge operation does not work because a memory cell in the unselected sub-block is in the S7 data state is not turned on by the pre-charge voltage VCHPCH, then this negative voltage will persist to the next programming pulse. If uncorrected, the inhibit bit line voltage may not be sufficient to prevent programming in memory cells where programming is not desired and program disturb will occur, thereby compromising the quality of the data being programmed.

One approach to preventing program disturb from occurring in a memory block that is operating in a sub-block mode with two sub-blocks is to program the lower sub-block SB0 using the ROP direction and pre-charging from the source side of the memory block and program the upper sub-block SB1 using the NOP direction and pre-charging from the drain side of the memory block. Then, the pre-charge voltage cannot be cut off by a programmed memory cell in an unselected sub-block. However, this strategy may result in increased neighboring word line interference (NWI) when programming in the upper sub-block SB1 and also may not be effective when programming one or more middle sub-blocks in a memory block that has been divided into three or more sub-blocks if the outer sub-blocks are already programmed.

One aspect of the present disclosure is related to a programming technique that allows all sub-blocks in a memory block to be programmed in the ROP direction with minimal impact from program disturb and NWI. This objective is achieved by ramping down, or discharging, certain word lines on one side of a selected word line being programmed from the pass voltage VREAD at the end of the verify operation at different times. This specific discharge pattern causes the negative charge that exists in the channel during the verify operation to fully discharge prior to the next programming pulse being applied to the selected word line. In some embodiments, the separate pre-charge pulse typically found between the verify operation of one program loop and the programming pulse of a next program loop can be incorporated into the discharge process, thereby improving overall device performance even if the discharging process may take an increased amount of time as compared to other programming techniques.

Figure 14:
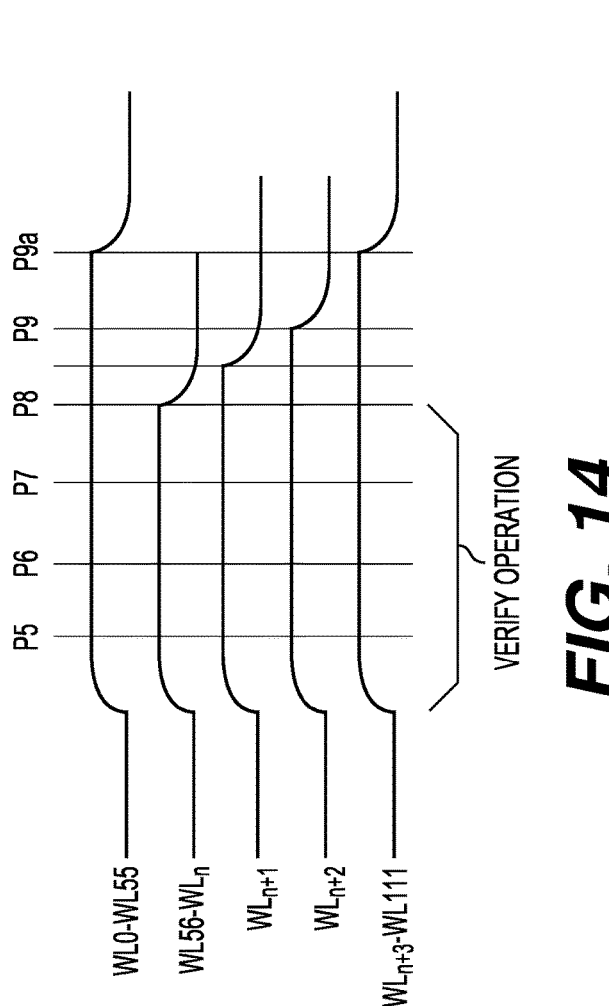
FIG. 14 illustrates the voltage waveforms of a plurality of word lines in a memory block during and after a verify operation according to an example embodiment of the present disclosure.

In an example string depicted in FIG. 13, a word line WLn of an upper sub-block SB1 is being programmed and the lower sub-block SB0 is closed, i.e., all word lines of the lower sub-block SB0 have bene programmed. As illustrated in FIG. 14, following the verify operation, the unprogrammed word lines of the selected sub-block and the selected word line (i.e., WL56-WLn) are ramped down, or discharged from their respective voltages, first at clock P8. Then, WLn+1, which is programmed and immediately adjacent the selected word line WLn, begins ramping down slightly after WLn, WLn+2 begins ramping down slightly after WLn+1, and WLn+3-WL111 begin ramping down slightly after WLn+2. Finally, the word lines WL0-WL55 of the unselected lower sub-block SB0 are all ramped down together at the same time, i.e., clock P9a. This technique squeezes the electrons in the channel during the verify operation out of the channel prior to or concurrent with pre-charge, thereby reducing the risk of program disturb in the memory cells being inhibited from programming during the next programming pulse to follow, even without a separate pre-charging pulse after the discharging operation is completed. When plotted, the voltage waveforms form a staircase-like pattern from the selected word line towards one side of the memory block, which could be either the source side or the drain side, as discussed below.

Figure 15:
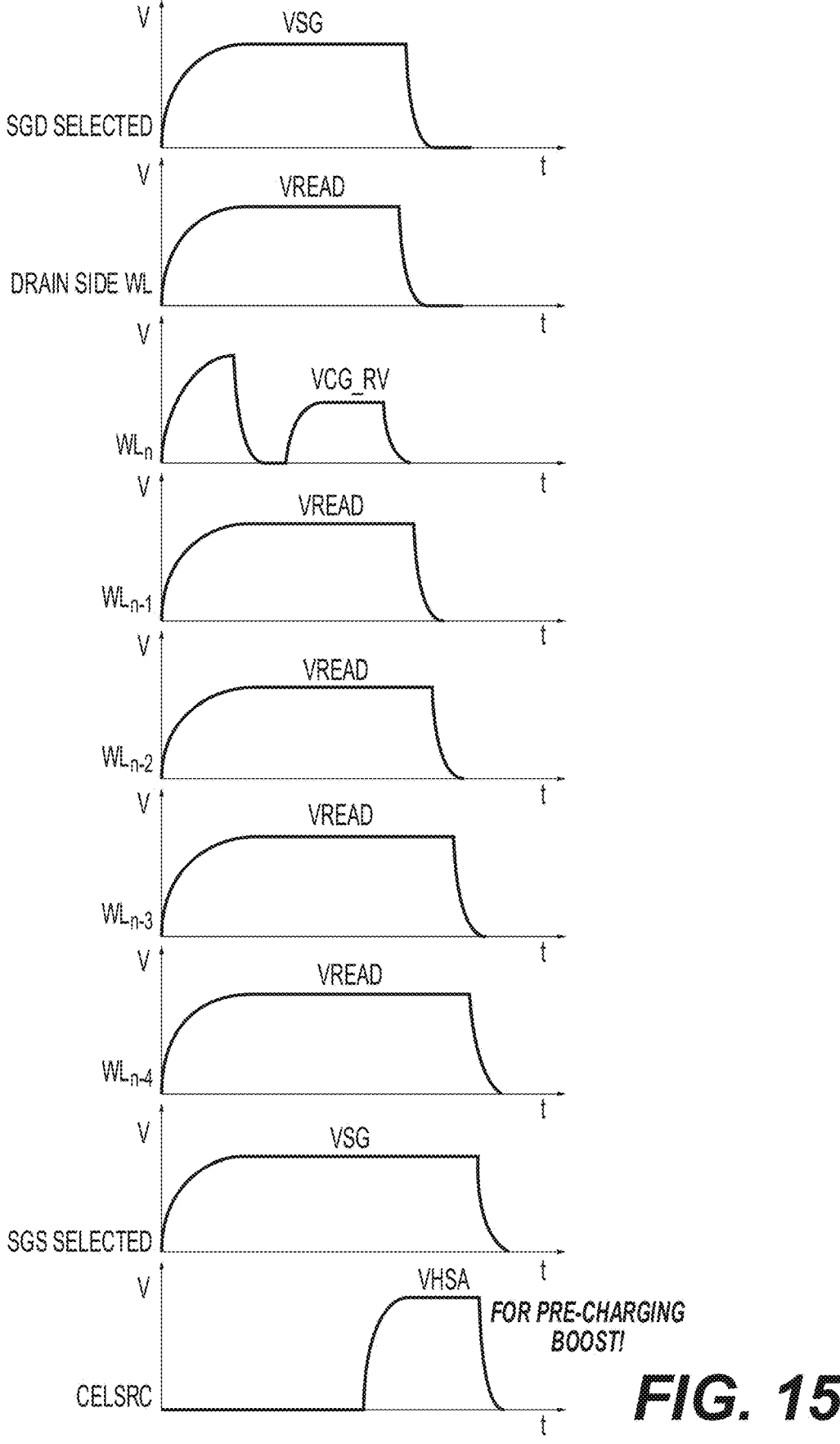
FIG. 15 illustrates the voltage waveforms of a plurality of components in a memory block during and after a verify operation according to one example embodiment of the present disclosure.
Figure 16:
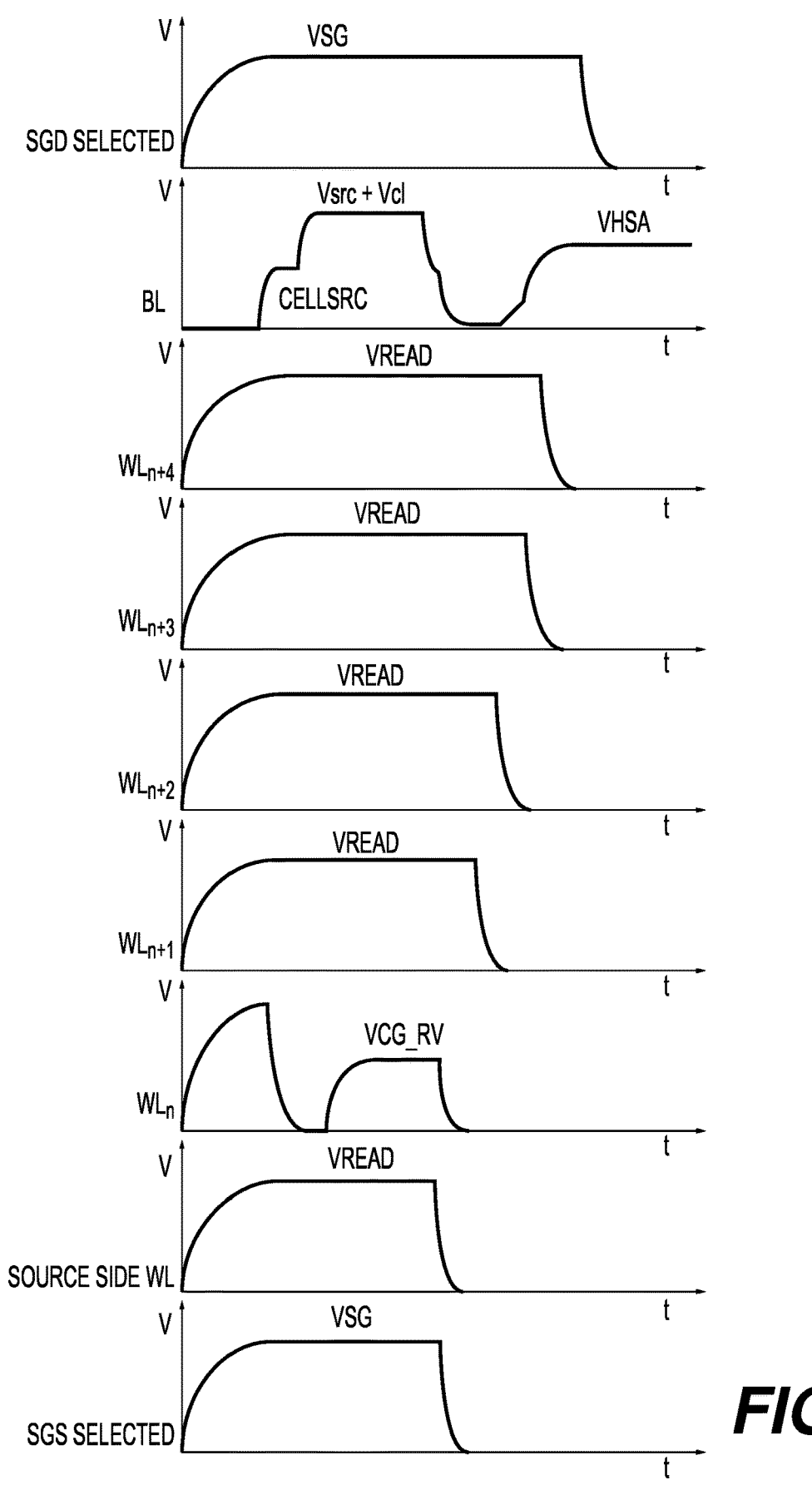
FIG. 16 illustrates the voltage waveforms of a plurality of components in a memory block during and after a verify operation according to another example embodiment of the present disclosure.

Turning now to FIGS. 15 and 16, within a selected sub-block, the pre-charge path including the staircase-like discharging waveform of the pass voltage VREAD can occur on either side of the selected word line WLn depending on certain conditions discussed below. That is, the pre-charge path can be either on the source side (hereinafter referred to as source-side staircase pre-charge "SSSP", FIG. 15) of the selected word line WLn or the drain side (hereinafter referred to as drain-side staircase pre-charge "DSSP", FIG. 16) of the selected word line WLn.

FIG. 15 illustrates an example embodiment of SSSP in that the "staircase" voltage discharge pattern is found on the source side of the selected word line WLn. As illustrated, the voltages of all drain-side word lines discharge from the pass voltage VREAD at approximately the same time that the selected word line WLn discharges from the verify voltage. At this time, the voltage applied to the source line ramps up from a low voltage to a much higher pre-charging voltage VHSA. After the source line begins ramping up to the VHSA voltage, the word lines on the source side of the selected word line WLn, sequentially and starting from WLn-1, begin to ramp down from VREAD, with each next word line further from WLn beginning to ramp down from VREAD slightly after the previous word line begins to ramp down from VREAD such that the word line of the sub-block nearest the source line is the last word line to begin to ramp down from VREAD. Thus, word lines WLn-1 through WL0 begin ramping down from the pass voltage VREAD only after the source line begins the pre-charge operation of ramping up to the VHSA voltage. By following this procedure, the electrons in the channel are squeezed out of the channel, and the portion of the channel that includes the memory cell of the selected word line WLn can be boosted to approximately the VHSA voltage. In an example embodiment, the time gap, or duration, from when the voltage applied to one word line (for example, WLn-1) begins to ramp down to when the next word line (for example, WLn-2) begins to ramp down is approximately one microsecond (1 µs).

FIG. 16 illustrates an example embodiment where the staircase-like discharging from the pass voltage VREAD takes place on the drain side of the selected word line WLn. This process is very similar to the process of FIG. 15, but all of the source side word lines ramp down together with the selected word line WLn, and the staircase-like ramping down begins with word line WLn+1 and continues, sequentially, to the last word line on the drain side of the selected sub-block. Also, in this embodiment, the boost voltage VHSA comes from the bit line coupled to the string on the drain side of the memory block rather than from the source line on the source side of the memory block.

In some embodiments, the staircase-like discharging may be in groups of multiple word lines that begin discharging together. For example, word lines WLn+1 through WLn+3 can be in a first group that begins discharging at a first time. WLn+4 through WLn+6 can be in a second group that begins discharging slightly later at a second time, and WLn+7 through WLn+9 can be in a third group that begins discharging at a still later third time. The number of word lines in each group can be any suitable number, and the groups can all include the same number of word lines or differing numbers of word lines.

In some embodiments, only a predetermined number of word lines adjacent the selected word line receive the staircase ramping down technique. The remaining word lines on the discharge side (either the source side or the drain side) all discharge together after the predetermined number of word lines sequentially discharge one after another or in groups. This may improve performance while still allowing the electrons in the channel at the end of the verify operation to exit the channel.

Turning now to FIGS. 17A-E, five different optimized programming conditions are provided in a memory block that includes two sub-blocks SB0, SB1 are illustrated. In each of these five scenarios, programming of the word lines follows the ROP direction (from the drain side towards the source side). The direction of the pre-charge operation (SSSP or DSSP) is determined based on which of the conditions the memory block is in and how many word lines have been programmed in the selected word line.

Figures 17A, 17B, 17C:
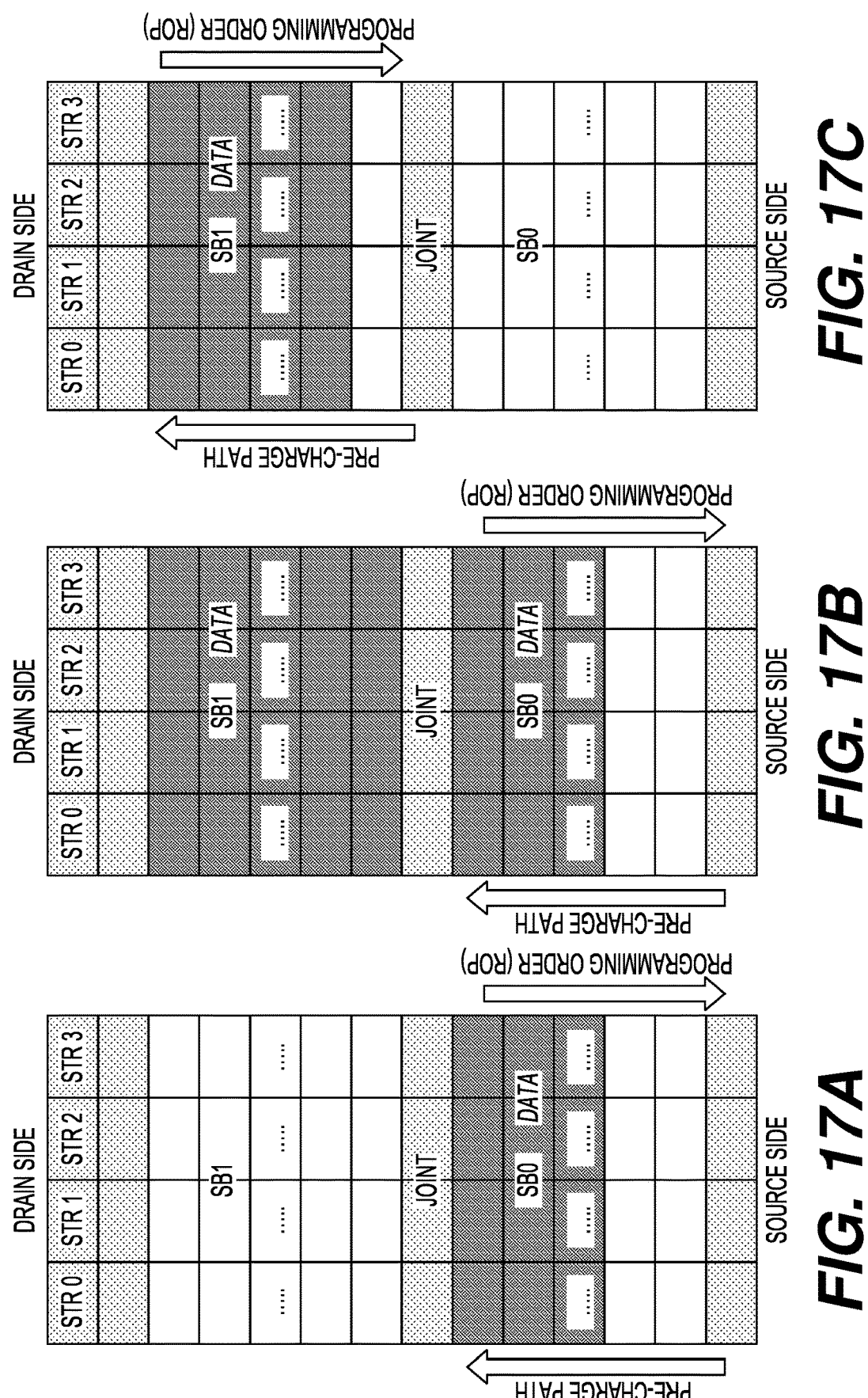
FIG. 17A illustrates the programming direction and pre-charge path during programming when the sub-blocks of a memory block are in a first condition.
FIG. 17B illustrates the programming direction and pre-charge path during programming when the sub-blocks of the memory block are in a second condition.
FIG. 17C illustrates the programming direction and pre-charge path during programming when the sub-blocks of the memory block are in a third condition.
Figures 17D, 17E, 18:
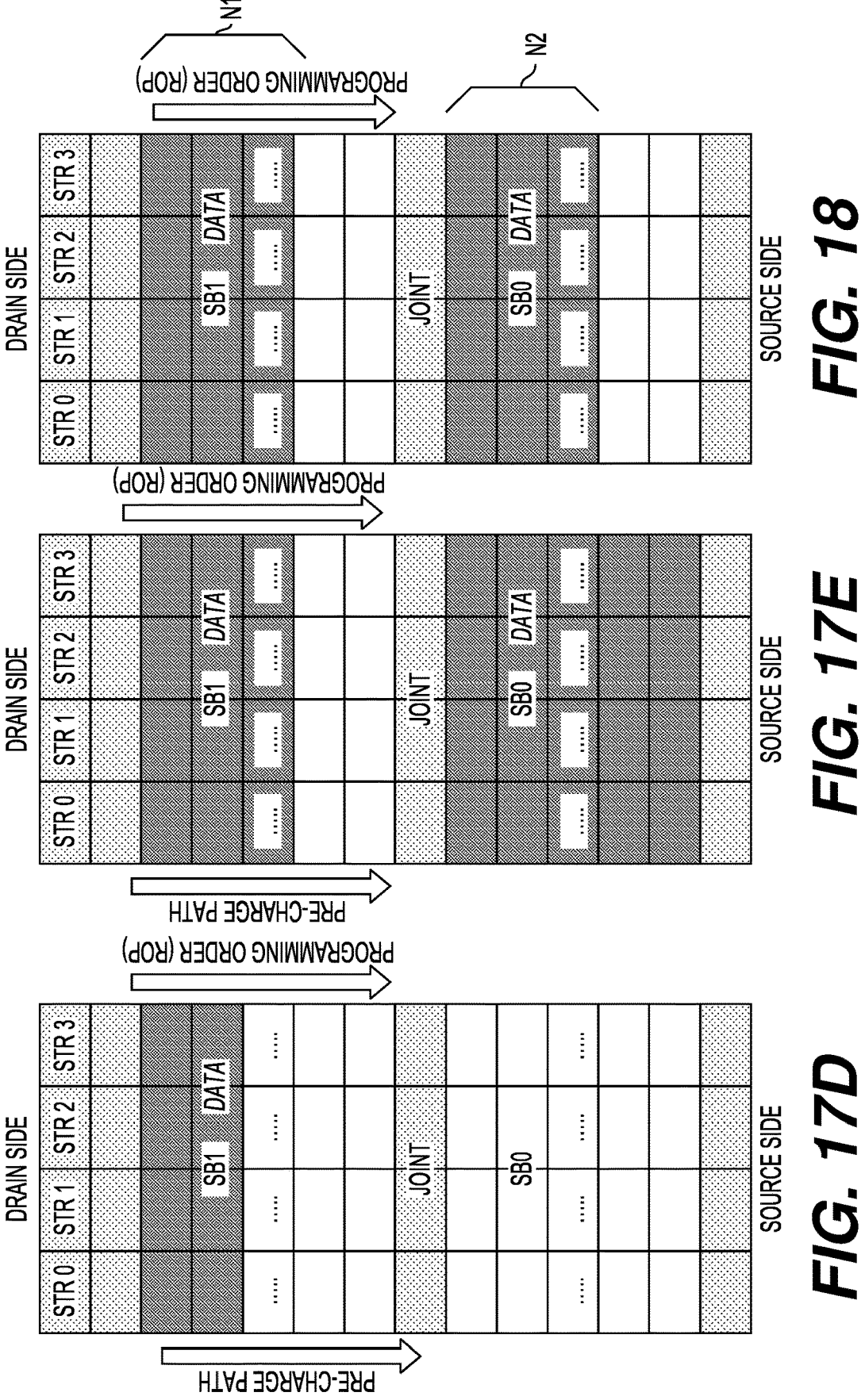
FIG. 17D illustrates the programming direction and pre-charge path during programming when the sub-blocks of the memory block are in a fourth condition.
FIG. 17E illustrates the programming direction and pre-charge path during programming when the sub-blocks of the memory block are in a fifth condition.
FIG. 18 illustrates the programming direction and pre-charge path during programming when the sub-blocks of the memory block are in a sixth condition.

In the condition of FIG. 17A, the upper sub-block SB1 is empty and the lower sub-block SB0 is being programmed. In this condition, the pre-charge path starts from the source-side of the memory block, e.g., SSSP (see the example of FIG. 15). In the condition of FIG. 17B, the upper sub-block SB1 is fully programmed and the lower sub-block SB0 is being programmed. In this condition, the pre-charge path starts from the source-side of the memory block, e.g., SSSP (see the example of FIG. 15). In the condition of FIG. 17E, the lower sub-block is fully programmed and the upper sub-block SB1 is being programmed. In this condition, the pre-charge path starts from the drain-side of the memory block, e.g., DSSP (see the example of FIG. 16).

In the condition of FIG. 17C, the lower sub-block SB0 is empty and the upper sub-block SB1 is more than half-way programmed. In this condition, the pre-charge path starts from the source-side of the memory block, e.g., SSSP (see the example of FIG. 15). In the scenario of FIG. 17D, the lower sub-block SB0 is empty and the upper sub-block SB1 is less than halfway programmed. In this condition, the pre-charge path starts from the drain side of the memory block, e.g., DSSP (see the example of FIG. 16). Thus, there is a threshold number N of word lines where programming of the upper sub-block SB1 transitions from the scenario of FIG. 17D to the scenario of FIG. 17C and the pre-charge path changes direction to optimize programming performance.

In some conditions, such as the condition schematically illustrated in FIG. 18, the upper sub-block SB1 may being programmed while the lower sub-block SB0 is partially open, i.e., some word lines are programmed and some word lines are not programmed. If the memory block is in this condition, the memory device determines how many word lines in the upper sub-block SB1 have been programmed and sets this number to the variable N1 and then determines how many word lines in the lower sub-block SB0 have been programmed and sets this number to the variable N2. If N1 is greater than N2, then the pre-charge path starts from the source side (see the example of FIG. 15) to minimize the pre-charge programming time tProg penalty since there will be fewer word lines to apply the staircase-like discharge operation on. On the other hand, if N2 is greater than N1, then the pre-charge path starts from the drain side (see the example of FIG. 16) to minimize the tProg penalty. If N1 is equal to N2, then either pre-charge path can be employed.

These programming techniques can also be employed in a memory block that is divided into three or more sub-blocks. In such cases, then which specific discharge pattern (SSSP or DSSP) is employed is determined based on the following conditions: the programming conditions of the unselected sub-blocks (empty or closed), and the number N of word lines already programmed in the selected sub-block. In the table of FIG. 19, the identifier "E" means that the sub-block is an unselected sub-block and is unprogrammed; the identifier "C" indicates that the sub-block is an unselected sub-block and is fully programmed (closed); the identifier "TP" indicates that the sub-block is the selected sub-block but is currently empty; the identifier "P1" indicates that the sub-block is the selected sub-block and that the number of programmed word lines in the selected sub-block is less than a threshold N; and the identifier "P2" indicates that the sub-block is the selected sub-block and that the number of programmed word lines in the selected sub-block is greater than the threshold N. There are three different pre-charge options: SSSP; DSSP; and SSSP and DSSP. The table of FIG. 19 identifies which pre-charge option to employ in the selected sub-block in each of the eight possible conditions. For example, if the selected sub-block is the lowest sub-block SB0, then regardless of whether the middle sub-block SB1 and the upper sub-block SB2 are empty or closed, the pre-charge path should be SSSP. If the selected sub-block is the middle sub-block SB1 and the unselected sub-blocks SB0, SB2 are both empty, then if the number of programmed word lines in SB1 is less than the threshold N, the DSSP pre-charge path should be followed, and if the number of programmed word lines in SB1 is greater than the threshold N, the SSSP pre-charge path should be followed. In an embodiment, this the information contained on this table can be stored in the memory device and referenced during programming to determine which pre-charge direction to employ when programming a sub-block by analyzing 'the condition of the memory block and the number of word lines already programmed in the selected sub-block and choosing the appropriate pre-charge direction.

Figure 20:
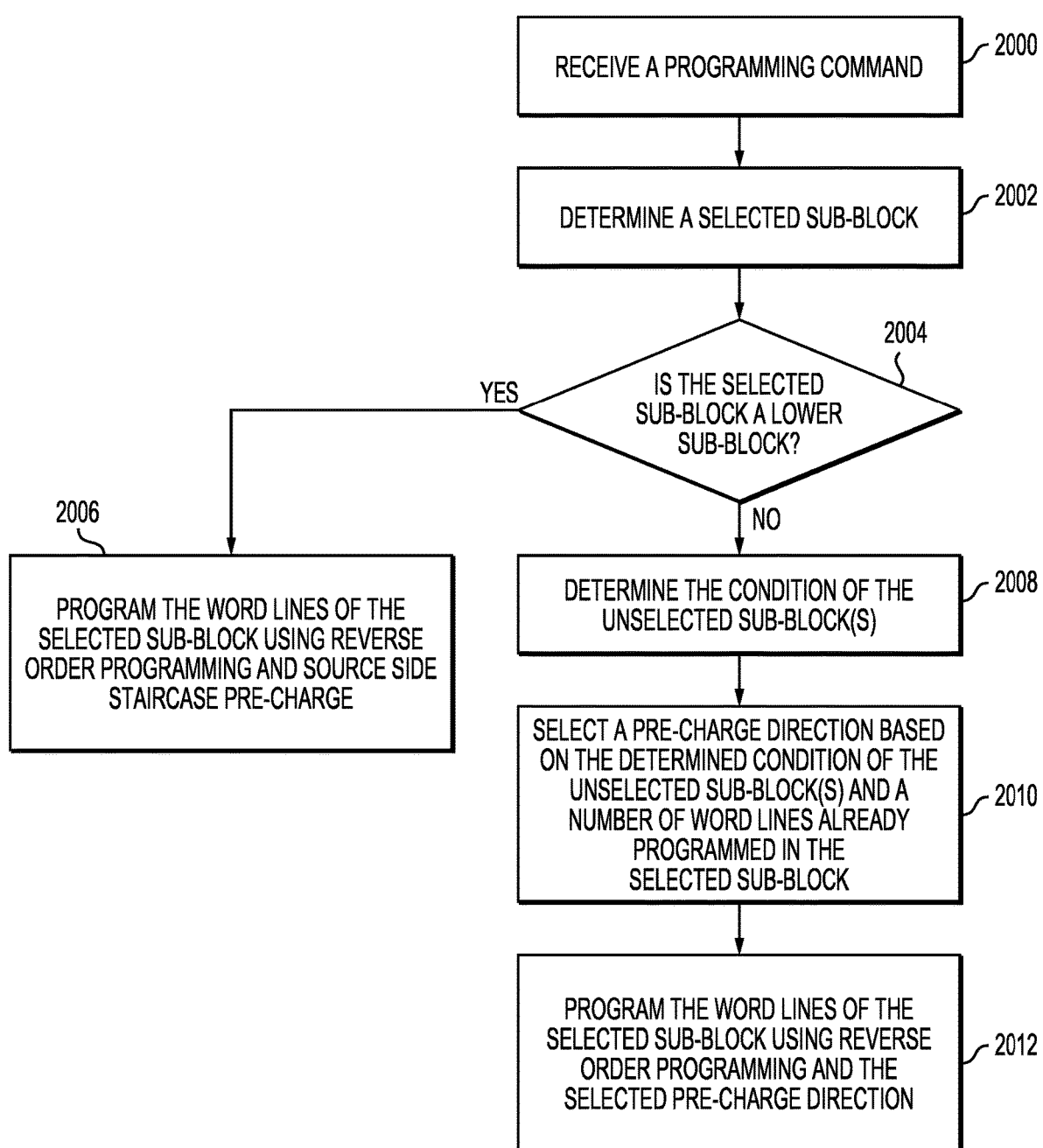
FIG. 20 is a flow chart illustrating the steps of programming a plurality of word lines in a sub-block according to an exemplary method.

Turning now to FIG. 20, a flow chart is provided that depicts the steps of programming a memory device according to an exemplary embodiment. At step 2000, a programming command is received. At step 2002, control circuitry in the memory device determines a selected sub-block, i.e., which sub-block of which memory block to write the data to.

At step 2004, the control circuitry determines if the selected sub-block is a lower sub-block, i.e., if it is a sub-block on a source side of its memory block. If the answer at step 2004 is "yes," then at step 2006, the control circuitry programs the word lines of the selected sub-block using the ROP direction and using the SSSP direction (for example, FIG. 15).

If the answer at decision step 2004 is "no," then at step 2008, the control circuitry determines the condition of the unselected sub-block or sub-blocks in the same memory block. At step 2010, the control circuitry selects a pre-charge direction based on the condition(s) of the unselected sub-block(s) and on a number of word lines that have already been programmed in the selected sub-block. At step 2012, the control circuitry programs the word lines of the selected sub-block using the ROP direction and the selected pre-charge direction.

"Selected word line" refers to a word line designated for use in a particular storage operation or memory operation. Certain storage operations such as programming, reading, or sensing, may be performed on memory cells of a selected word line through a series of one or more steps. Other storage operations such as erasing memory cells, in one embodiment, may be performed on memory cells of a plurality of word lines simultaneously through a series of one or more steps. In such embodiments, the erase operation may be performed on multiple selected word lines.

Other word lines that are not a focus of a storage operation are referred to as unselected word lines. "Unselected word line" refers to a set of word lines that are not designated for use in a particular storage operation or memory operation. This means that performing the storage operation is not intended to change the memory state of memory cells of the unselected word lines. Changes to memory state of memory cells of the unselected word lines is inadvertent and may be considered a disturb or unintended consequence.

Various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of programming a memory device, comprising the steps of:

preparing a memory device that includes at least one memory block, the at least one memory block having a source side and a drain side and including a plurality of memory cells arranged in a plurality of word lines, and the plurality of word lines being arranged in a plurality of sub-blocks that are configured to be programmed and erased independently of one another;

determining a location of a selected sub-block of the plurality of sub-blocks within the at least one memory block and a programming condition of at least one unselected sub-block of the plurality of sub-blocks;

programming at least one word line in the selected sub-block in a plurality of program loops, the program loops including a pre-charging process, and the pre-charging process starts from either the source side or the drain side of the at least one memory block based on at least one of the location of the selected sub-block within the at least one memory block and the programming condition of the at least one unselected sub-block; and sequentially programming the word lines of the selected sub-block of the plurality of sub- blocks in a direction from the drain side towards the source side regardless of the location of the selected sub-block within the at least one memory block and regardless of the programming condition of the at least one unselected sub-block.

2. The method of programming the memory device as set forth in claim 1, wherein each program loop of the plurality of program loops includes a verify operation that includes applying a pass voltage VREAD to a plurality of unselected word lines in the at least one memory block.

3. The method of programming the memory device as set forth in claim 2, wherein at an end of the verify operation of each program loop, on only one side of a selected word line, at least some of the unselected word lines begin discharging from the pass voltage VREAD one after the other in a direction towards either the source side of the at least one memory block or the drain side of the at least one memory block.

4. The method of programming the memory device as set forth in claim 3, wherein the side of the selected word line that the unselected word lines discharge one after the other is the same side of the selected word line that the pre-charging process starts at.

5. The method of programming the memory device as set forth in claim 4, wherein prior to some of the unselected word lines completing discharging, a pre-charge voltage is applied to at least one of a source line on the source side of the at least one memory block or a bit line on the drain side of the at least one memory block to pre-charge at least one channel in the at least one memory block prior to the completion of the discharging of some of the unselected word lines.

6. The method of programming the memory device as set forth in claim 5, wherein if the selected sub-block is a lower sub-block located on the source side of the at least one memory block, then the pre-charging process starts from the source side of the at least one memory block.

7. The method of programming the memory device as set forth in claim 5, wherein if the selected sub-block is an upper sub-block that is located on the drain side of the at least one memory block and the at least one unselected sub-block is a closed sub-block, then the pre-charging process starts from the drain side of the at least one memory block.

8. The method of programming the memory device as set forth in claim 5, wherein if the selected sub-block is an upper sub-block that is located on the drain side of the at least one memory block and the at least one unselected sub-block is an open sub-block, then the method further includes the steps of:

determining a number of programmed word lines in the selected sub-block;

comparing the number of programmed word lines in the selected sub-block to a threshold;

if the number of programmed word lines in the selected sub-block is less than the threshold, then the pre-charging process starts from the drain side of the at least one memory block; and if the number of programmed word lines in the selected sub-block is greater than the threshold, then the pre-charging process starts from the source side of the at least one memory block.

9. A memory device, comprising:

at least one memory block, the at least one memory block having a source side and a drain side and including a plurality of memory cells arranged in a plurality of word lines, and the plurality of word lines being arranged in a plurality of sub-blocks that are configured to be programmed and erased independently of one another; and control circuitry configured to program the memory cells of a selected sub-block of the plurality of sub-blocks, the control circuitry being configured to;

determine a location of a selected sub-block of the plurality of sub-blocks within the at least one memory block and a programming condition of at least one unselected sub-block of the plurality of sub-blocks, program at least one word line in the selected sub-block in a plurality of program loops, the program loops including pre-charging processes, and wherein the control circuitry pre-charges a plurality of channels in the at least one memory block from either the source side or the drain side of the at least one memory block based on at least one of the location of the selected sub-block within the at least one memory block and the programming condition of the at least one unselected sub-block, and sequentially program the word lines of the selected sub-block of the plurality of sub-blocks in a direction from the drain side towards the source side of the at least one memory block regardless of the location of the selected sub-block within the at least one memory block and regardless of the programming condition of the at least one unselected sub-block.

10. The memory device as set forth in claim 9, wherein each program loop of the plurality of program loops includes a verify operation that includes the control circuitry applying a pass voltage VREAD to a plurality of unselected word lines in the at least one memory block.

11. The memory device as set forth in claim 10, wherein at an end of the verify operation of each program loop, on only one side of a selected word line, the control circuitry begins discharging at least some of the unselected word lines from the pass voltage VREAD one after the other in a direction towards either the source side of the at least one memory block or the drain side of the at least one memory block.

12. The memory device as set forth in claim 11, wherein the side that the unselected word lines begin discharging from the pass voltage VREAD one after another is the same side of the selected word line that the control circuitry pre-charges the plurality of channels from.

13. The memory device as set forth in claim 12, wherein prior to some of the unselected word lines completing discharging, the control circuitry applies a pre-charge voltage to at least one of a source line on the source side of the at least one memory block or a bit line on the drain side of the at least one memory block to pre-charge at least one channel in the at least one memory block prior to the completion of the discharge process.

14. The memory device as set forth in claim 13, wherein if the selected sub-block is a lower sub-block located on the source side of the at least one memory block, then the control circuitry starts the pre-charging process from the source side of the at least one memory block.

15. The memory device as set forth in claim 13, wherein if the selected sub-block is an upper sub-block that is located on the drain side of the at least one memory block and the at least one unselected sub-block is a closed sub-block, then the control circuitry starts the pre-charging process from the drain side of the at least one memory block.

16. The memory device as set forth in claim 13, wherein if the selected sub-block is an upper sub-block that is located on the drain side of the at least one memory block and the at least one unselected sub-block is an open sub-block, then the control circuitry is further configured to:

determine a number of programmed word lines in the selected sub-block;

compare the number of programmed word lines in the selected sub-block to a threshold;

if the number of programmed word lines in the selected sub-block is less than the threshold, then the control circuitry pre-charges the plurality of channels from the drain side of the at least one memory block; and if the number of programmed word lines in the selected sub-block is greater than the threshold, then the control circuitry pre-charges the plurality of channels from the source side of the at least one memory block.

17. An apparatus, comprising:

at least one memory block, the at least one memory block having a source side and a drain side and including a plurality of memory cells arranged in a plurality of word lines, and the plurality of word lines being arranged in a plurality of sub-blocks that are configured to be programmed and erased independently of one another; and a programming means for programming the memory cells of the at least one memory block to include at least three bits of data per memory cell, when programming a selected sub-block of the plurality of sub-blocks, the programming means being configured to;

determine a location of a selected sub-block of the plurality of sub-blocks within the at least one memory block and determine a programming condition of at least one unselected sub-block of the plurality of sub-blocks, program a selected word line in the selected sub-block in a plurality of program loops, the program loops including programming pulses and verify operations, during each of the verify operations, apply a pass voltage VREAD to a plurality of unselected word lines, begin discharging the unselected word lines on one side of a selected word line one after the other to remove electrons from a plurality of channels of the at least one memory block on one side of the selected word line, and sequentially program the word lines of the selected sub-block of the plurality of sub-blocks in a direction from the drain side towards the source side of the at least one memory block regardless of the location of the selected sub-block within the memory block and regardless of the programming condition of the at least one unselected sub-block.

18. The apparatus as set forth in claim 17, wherein the programming means is further configured to pre-charge the plurality of channels of the at least one memory block from the side of the selected word line that the programming means discharges the unselected word lines one after the other.

* * * * *